(12) United States Patent
Jung et al.

(10) Patent No.: US 11,476,397 B2
(45) Date of Patent: Oct. 18, 2022

(54) DISPLAY DEVICE AND MANUFACTURING METHOD THEREOF

(71) Applicant: Samsung Display Co., Ltd., Yongin-si (KR)

(72) Inventors: Eui Suk Jung, Yongin-si (KR); Tae Gyun Kim, Yongin-si (KR); Jun Hong Park, Yongin-si (KR); Jun Chun, Yongin-si (KR); Hyun Young Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/088,229

(22) Filed: Nov. 3, 2020

(65) Prior Publication Data

US 2021/0202810 A1 Jul. 1, 2021

(30) Foreign Application Priority Data

Dec. 30, 2019 (KR) .......................... 10-2019-0178540

(51) Int. Cl.
*H01L 33/60* (2010.01)
*H01L 25/16* (2006.01)
*H01L 27/12* (2006.01)
*H01L 23/00* (2006.01)
*H01L 33/62* (2010.01)

(52) U.S. Cl.
CPC .............. *H01L 33/60* (2013.01); *H01L 24/24* (2013.01); *H01L 24/82* (2013.01); *H01L 25/167* (2013.01); *H01L 27/1259* (2013.01); *H01L 33/62* (2013.01); *H01L 2224/24011* (2013.01); *H01L 2224/82143* (2013.01)

(58) Field of Classification Search
None
See application file for complete search history.

(56) References Cited

U.S. PATENT DOCUMENTS

| | | | |
|---|---|---|---|
| 8,840,262 B2 * | 9/2014 | Chang | H01L 33/60 362/97.3 |
| 10,490,537 B2 | 11/2019 | Bae et al. | |
| 2013/0105978 A1 * | 5/2013 | Hung | H01L 33/60 438/653 |
| 2019/0081261 A1 | 3/2019 | Lee et al. | |

FOREIGN PATENT DOCUMENTS

| | | | | |
|---|---|---|---|---|
| CN | 1601777 A | * | 3/2005 | ............ H01L 33/60 |
| CN | 109585633 A | * | 4/2019 | |
| KR | 10-2019-0012970 A | | 2/2019 | |
| KR | 10-2019-0029831 A | | 3/2019 | |

* cited by examiner

*Primary Examiner* — Robert K Carpenter
(74) *Attorney, Agent, or Firm* — Lewis Roca Rothgerber Christie LLP

(57) ABSTRACT

A display device according to an exemplary embodiment of the present disclosure comprises an insulation layer on a substrate and having a groove concave in a direction toward the substrate; a first reflective layer on at least a portion of the insulation layer; and a display element layer on the insulation layer and the first reflective layer, the display element layer including a light emitting element overlapping at least a portion of the groove.

12 Claims, 22 Drawing Sheets

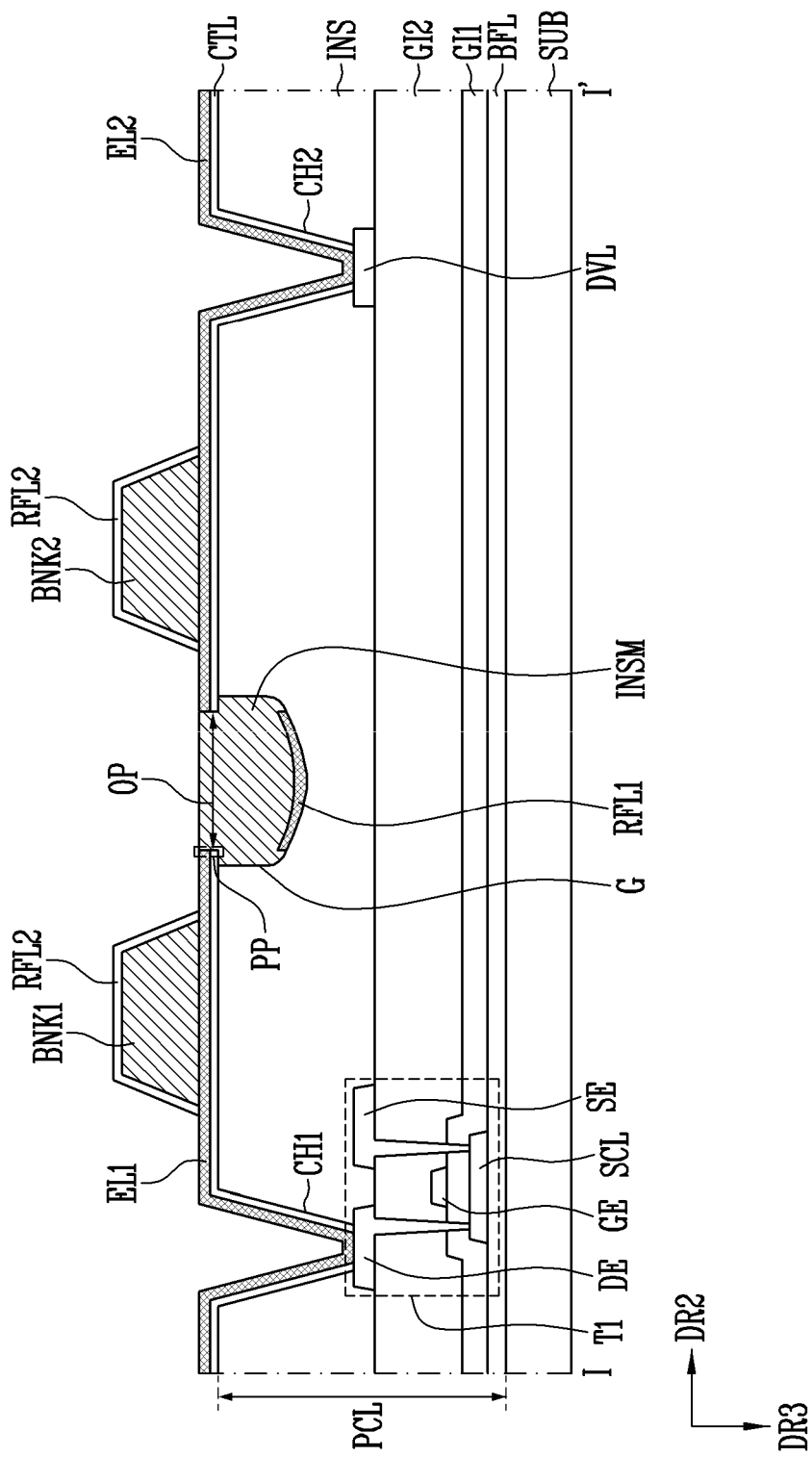

DISPLAY DEVICE AND MANUFACTURING METHOD THEREOF

CROSS-REFERENCE TO RELATED APPLICATION

This application claims priority to and the benefit of Korean Patent Application No. 10-2019-0178540 filed in the Korean Intellectual Property Office on Dec. 30, 2019, the entire contents of which are incorporated herein by reference.

BACKGROUND

1. Field

Embodiments of the present disclosure relate to a display device and a manufacturing method thereof.

2. Description of the Related Art

A light emitting diode (hereinafter referred to as LED) shows relatively good durability even in harsh environmental conditions and has excellent performance in terms of lifetime and luminance.

Recently, research into applying the LED to various display devices have been actively performed.

As part of this research, a technique for manufacturing an ultra-small rod-shaped LED, which is as small as micro scale or nano scale, have been developed using an inorganic crystal structure, for example, a structure in which a nitride semiconductor is grown.

For example, a bar-shaped LED may be manufactured to a size small enough to constitute a pixel of the self-luminous display device.

SUMMARY

An exemplary embodiment of the present disclosure provides a display device having excellent luminous efficiency and a manufacturing method thereof.

A display device according to an exemplary embodiment of the present disclosure includes an insulation layer on a substrate and having a groove concave in a direction toward the substrate; a first reflective layer on at least a portion of the insulation layer; and a display element layer on the insulation layer and the first reflective layer, the display element layer including a light emitting element overlapping at least a portion of the groove.

In an exemplary embodiment of the present disclosure, the first reflective layer may be on the groove and overlap the light emitting element.

In an exemplary embodiment of the present disclosure, the display element layer may further include a first electrode extending in the first direction and electrically coupled to the light emitting element; and a second electrode spaced apart from the first electrode in a second direction different from the first direction and electrically coupled to the light emitting element.

In an exemplary embodiment of the present disclosure, each of the first electrode and the second electrode may have a portion overlapping a portion of the groove.

In an exemplary embodiment of the present disclosure, a distance between the first electrode and the second electrode in the second direction may be less than a width of the groove in the second direction.

In an exemplary embodiment of the present disclosure, a distance between the first electrode and the second electrode in the second direction may be the same as a width of the first reflective layer in the second direction.

In an exemplary embodiment of the present disclosure, the first and second electrodes and the first reflective layer may include the same or substantially the same metallic material.

In an exemplary embodiment of the present disclosure, the groove may be filled with insulation material, and the light emitting element is on the insulation material.

In an exemplary embodiment of the present disclosure, the insulation material may form a flat surface with the first and second electrodes.

In an exemplary embodiment of the present disclosure, the display element layer may further comprise a first bank on the first electrode; and a second bank on the second electrode.

In an exemplary embodiment of the present disclosure, the display element layer may further comprise a second reflective layer on the first and second banks.

In an exemplary embodiment of the present disclosure, the display device may further include an intermediate layer between the first electrode and the insulation layer and between the second electrode and the insulation layer, and having an opening overlapping the groove.

In an exemplary embodiment of the present disclosure, a distance between the first electrode and the second electrode in the second direction may be the same or substantially the same as a width of the opening in the second direction.

In an exemplary embodiment of the present disclosure, a width of the opening in the second direction may be less than a width of the groove in the second direction.

In an exemplary embodiment of the present disclosure, the display element layer may further comprise a first contact electrode on the first electrode and configured to electrically connect the first electrode and the light emitting element; and a second contact electrode on the second electrode and configured to electrically connect the second electrode and the light emitting element.

A manufacturing method of a display device according to an exemplary embodiment of the present disclosure includes forming an insulation layer on a substrate; forming an intermediate layer having an opening on the insulation layer; forming a groove concave in a direction toward the substrate by etching a portion of the insulation layer exposed by the opening; forming a first electrode and a second electrode that extend in a first direction and are spaced apart from each other in a second direction different from the first direction on the intermediate layer; forming a first reflective layer on at least a portion of the groove; filling an insulation material in the groove; and providing a light emitting element on the substrate including the first and second electrodes, and applying an alignment signal to the first and second electrodes to align the light emitting element between the first electrode and the second electrode. The light emitting element may overlap the groove.

In an exemplary embodiment of the present disclosure, in the forming the groove, a width of the groove in the second direction may be larger than a width of the opening in the second direction.

In an exemplary embodiment of the present disclosure, the filling an insulation material in the groove may further include forming a first bank on the first electrode and forming a second bank on the second electrode.

In an exemplary embodiment of the present disclosure, the manufacturing method of the display device may further include forming a second reflective layer on the first and second banks.

In an exemplary embodiment of the present disclosure, the manufacturing method of the display device may further include forming a first contact electrode electrically coupling the first electrode and the light emitting element and a second contact electrode electrically coupling the second electrode and the light emitting element.

According to an exemplary embodiment of the present disclosure, a display device having excellent luminous efficiency can be provided.

According to an exemplary embodiment of the present disclosure, luminous efficiency of the light emitting element can be further improved by providing a first reflective layer overlapping the light emitting element on the insulation layer.

According to an exemplary embodiment of the present disclosure, a manufacturing method of a display device that can easily manufacture a display device having excellent luminous efficiency can be provided.

However, the effect of the subject matter of the present disclosure is not limited to the effects described above, but may be variously extended in a range that does not depart from the spirit and scope of the present disclosure.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

FIGS. 8A to 8L are cross-sectional views sequentially showing a manufacturing method of a display device according to an exemplary embodiment of the present disclosure.

DETAILED DESCRIPTION

Figure 1A:
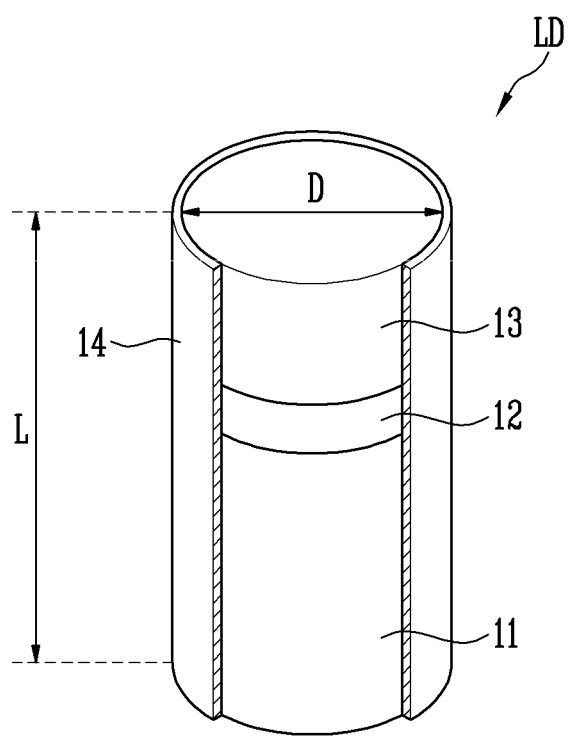
FIGS. 1A and 1B are perspective views showing a light emitting element according to an exemplary embodiment of the present disclosure.

It will be apparent to those skilled in the art that various modifications and variations can be made to the subject matter of the present disclosure without departing from the spirit or scope of the present disclosure, and specific exemplary embodiments are exemplified in the drawings and explained in the detailed description. Thus, it is intended that the present disclosure covers modifications and variations of the subject matter of this disclosure provided they come within the scope of the present disclosure and their equivalents.

Like reference numerals designate like elements throughout the specification. In the accompanying drawings, dimensions of structures may be exaggerated for clarity. The terms, 'first', 'second' and the like may be simply used for description of various constituent elements, but those meanings may not be limited to the restricted meanings. The above terms are used only for distinguishing one constituent element from other constituent elements. For example, a first constituent element may be referred to as a second constituent element and similarly, the second constituent element may be referred to as the first constituent element within the scope of the appended claims. When explaining the singular, unless explicitly described to the contrary, it may be interpreted as the plural meaning.

In the specification, the word "comprise" or "has" is used to specify existence of a feature, a numbers, a process, an operation, a constituent element, a part, or a combination thereof, and it will be understood that existence or additional possibility of one or more other features or numbers, processes, operations, constituent elements, parts, or combinations thereof are not excluded in advance. In addition, it will be understood that when an element such as a layer, film, region, or substrate is referred to as being "on" another element, it can be directly on the other element or intervening elements may also be present. In the specification, it will be understood that when an element such as a layer, film, region, or substrate is referred to as being "on" another element, the direction is not limited to an upper direction and include a side direction or a lower direction. In contrast, It will be understood that when an element such as a layer, film, region, or substrate is referred to as being "beneath" another element, it can be directly beneath the other element or intervening elements may also be present.

Hereinafter, exemplary embodiments of the present disclosure will be described in further detail with reference to the accompanying drawings.

Figure 1B:
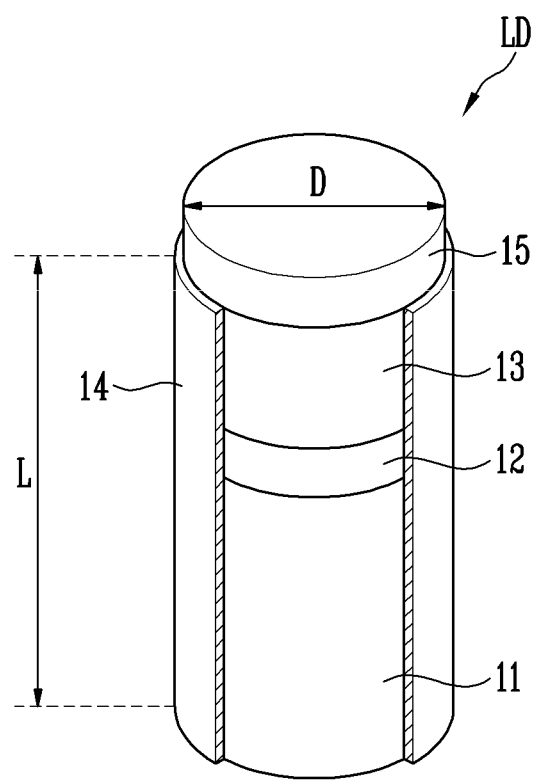

FIGS. 1A and 1B are perspective views showing a light emitting element according to an exemplary embodiment of the present disclosure. In FIGS. 1A and 1B, a circular cylindrical light emitting element LD is illustrated, but the present disclosure is not limited thereto.

Referring to FIGS. 1A and 1B, the light emitting element LD according to an exemplary embodiment of the present disclosure may include a first semiconductor layer 11, a second semiconductor layer 13, and an active layer 12 interposed between the first semiconductor layer 11 and the second semiconductor layer 13.

For example, the light emitting element LD may be implemented as a laminate in which the first semiconductor layer 11, the active layer 12, and the second semiconductor layer 13 are sequentially stacked.

According to an exemplary embodiment of the present disclosure, the light emitting element LD may be provided in a bar shape (or a rod shape) extending in one direction. When an extending direction of the light emitting element LD is referred to as the length direction, the light emitting element LD may have one end and the other end in the length direction.

In an exemplary embodiment of the present disclosure, one of the first semiconductor layer 11 and the second semiconductor layer 13 may be located at one end (e.g., a first portion), and the other of the first semiconductor layer 11 and the second semiconductor layer 13 may be located at the other end (e.g., a second portion).

The light emitting element LD may be provided in various suitable shapes. For example, the light emitting element LD may have a rod-like shape or a bar-like shape that is long in the length direction (e.g., aspect ratio is larger than 1). In an exemplary embodiment of the present disclosure, the length L of the light emitting element LD in the length direction may be larger than diameter D thereof (or width of a cross section). The light emitting element LD may include, for example, a light emitting diode manufactured in ultra-small size having a diameter (D) and/or length (L) of about micro scale (e.g., 100 nm to 1 μm) or nano scale (e.g., 1 nm to 100 nm). In an exemplary embodiment of the present disclosure, the size of the light emitting element LD may be changed to meet the requirements (or design conditions) of an applied lighting device or a self-luminescence display device.

For example, the first semiconductor layer 11 may include at least one n-type semiconductor layer. For example, the first semiconductor layer 11 may include at least one semiconductor material selected from InAlGaN, GaN, AlGaN, InGaN, AlN, and InN, and may include a semiconductor layer doped with a first conductive dopant such as Si, Ge, Sn, and/or the like.

The material constituting the first semiconductor layer 11 is not limited thereto, and the first semiconductor layer 11 may be formed of various suitable materials in addition thereto.

The active layer 12 may be formed on the first semiconductor layer 11 and may be formed as a single or multiple quantum well structure. In various exemplary embodiments of the present disclosure, a cladding layer doped with a conductive dopant may be formed on and/or under the active layer 12. For example, the cladding layer may be implemented as an AlGaN layer and/or an InAlGaN layer. In addition, materials such as AlGaN and AlInGaN may also be used as the active layer 12.

When an electric field of a set or predetermined voltage or more is applied to both ends of the light emitting element LD, the light emitting element LD emits light while electron-hole pairs are combined in the active layer 12.

The second semiconductor layer 13 may be provided on the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material selected from InAlGaN, GaN, AlGaN, InGaN, AlN, and InN, and may include a semiconductor layer doped with a second conductive dopant such as Mg, and/or the like.

The material forming the second semiconductor layer 13 is not limited thereto, and the second semiconductor layer 13 may be formed of various suitable materials.

According to an exemplary embodiment of the present disclosure, the light emitting element LD may further include a different phosphor layer, an active layer, a semiconductor layer and/or an electrode on and/or under each layer in addition to the first semiconductor layer 11, the active layer 12 and the second semiconductor layer 13 described above.

In an exemplary embodiment, the light emitting element LD may further include at least one electrode on one side (e.g., upper surface) of the second semiconductor layer 13 or on one side (e.g., lower surface) of the first semiconductor layer 11.

For example, as shown in FIG. 1B, the light emitting element LD may further include an electrode 15 on one side of the second semiconductor layer 13. The electrode 15 may be an ohmic contact electrode, but the present disclosure is not limited thereto. According to an exemplary embodiment, the electrode 15 may be a Schottky contact electrode (e.g., an electrode formed by a junction of a semiconductor and a metal). In addition, the electrode 15 may include a metal and/or metal oxide. For example, the electrode 15 may be formed alone or in combination with chromium (Cr), titanium (Ti), aluminum (Al), gold (Au), nickel (Ni), ITO and/or oxide and/or alloy thereof, but the present disclosure is not limited thereto. In addition, according to an exemplary embodiment, the electrode 15 may be substantially transparent or translucent. Accordingly, light generated by the light emitting element LD may penetrate the electrode 15 and be emitted to the outside of the light emitting element LD.

In addition, the light emitting element LD may further include an insulation layer 14. However, according to an exemplary embodiment of the present disclosure, the insulation layer 14 may be omitted or may be provided so as to cover only some of the first semiconductor layer 11, the active layer 12, and the second semiconductor layer 13.

For example, the insulation layer 14 may be provided at portions other than both ends of the light emitting element LD so that both ends of the light emitting element LD may be exposed.

For better understanding and ease of description, In FIGS. 1A and 1B, a portion of the insulation layer 14 is removed. In fact, the light emitting element LD may be surrounded by the insulation layer 14 on all sides.

The insulation layer 14 may be provided to surround at least a portion of an outer circumferential surface of the first semiconductor layer 11, the active layer 12 and/or the second semiconductor layer 13. For example, the insulation layer 14 may be provided to surround at least the outer circumferential surface of the active layer 12. In addition, when the light emitting element LD includes the electrode 15, the insulation layer 14 may be provided to surround at least a portion of the outer circumferential surface of the electrode 15.

According to an exemplary embodiment of the present disclosure, the insulation layer 14 may include a transparent insulation material. For example, the insulation layer 14 may include at least one insulation material selected from the group consisting of $SiO_2$, $Si_3N_4$, $Al_2O_3$, and $TiO_2$, but the present disclosure is not limited thereto. The insulation layer 14 may include various suitable insulation materials.

When the insulation layer 14 is provided to the light emitting element LD, it is possible to prevent or reduce a degree or likelihood of a short-circuit of the active layer 12 with a first and/or second electrode.

In addition, by forming the insulation layer 14, it is possible to minimize or reduce surface defects of the light emitting element LD to improve life-span and efficiency. In addition, when a plurality of light emitting elements LD are closely arranged, the insulation layer 14 may prevent or reduce a degree or likelihood of an unwanted a short-circuit that may otherwise occur between the light emitting elements LD.

The light emitting element LD described above may be used as a light emitting source of various suitable display devices. For example, the light emitting element LD may be used as a light source element of a lighting device or a light emitting display device.

Figure 2A:
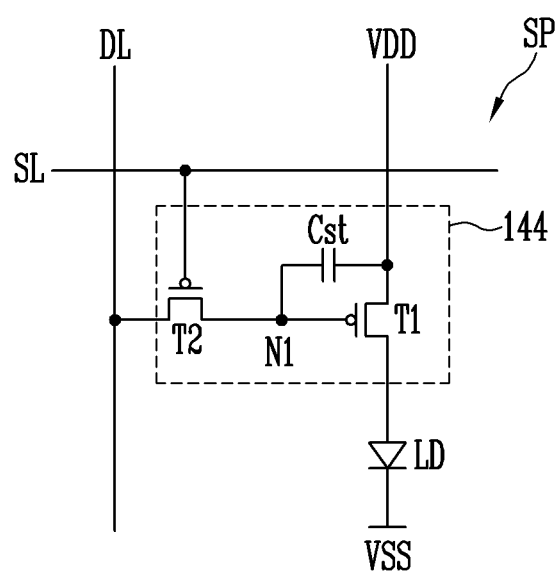
FIGS. 2A and 2B are circuit diagrams showing unit light emitting area of a display device according to an exemplary embodiment of the present disclosure.
Figure 2B:
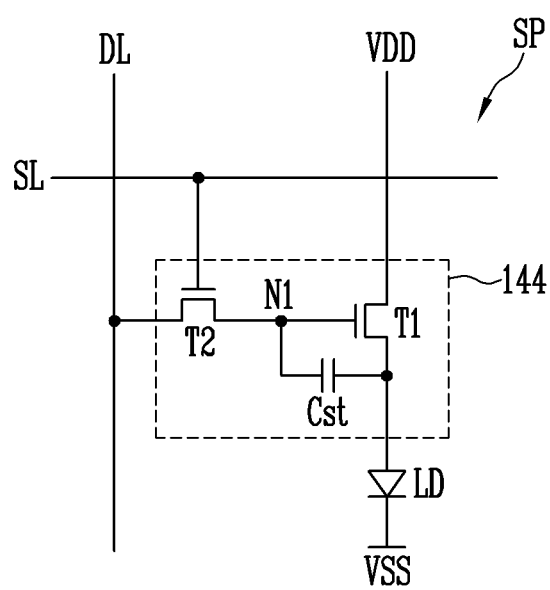

FIGS. 2A and 2B are circuit diagrams showing unit light emitting area of a display device according to an exemplary embodiment of the present disclosure.

FIGS. 2A and 2B show an example of pixels constituting an active light emitting display panel. In an exemplary embodiment of the present disclosure, the unit light emitting area may be a pixel area in which one sub-pixel is provided.

Referring to FIG. 2A, the sub-pixel SP may include at least one light emitting element LD and a pixel driving circuit 144 coupled to drive the light emitting element LD.

A first electrode (e.g., an anode) of the light emitting element LD is coupled to a first driving power supply VDD via the pixel driving circuit 144, and a second electrode (e.g., a cathode) of the light emitting element LD is coupled to a second driving power supply VSS.

The first driving power supply VDD and the second driving power supply VSS may have different potentials. For example, the second driving power source VSS may have a potential lower than a potential of the first driving power source VDD by more than threshold voltage of the light emitting element LD Each of the light emitting elements LD may emit light with luminance corresponding to the driving current controlled by the pixel driving circuit 144.

FIG. 2A shows an exemplary embodiment in which only one light emitting element LD is included in a sub-pixel SP, but the present disclosure is not limited thereto. For example, the sub-pixel SP may include a plurality of light emitting elements LD that are coupled in parallel with each other.

According to an exemplary embodiment of the present disclosure, the pixel driving circuit 144 may include a first transistor T1, a second transistor T2 and a storage capacitor Cst. However, the structure of the pixel driving circuit 144 is not limited to an exemplary embodiment shown in FIG. 2A.

A first electrode of the first transistor T1 (e.g., a driving transistor) is coupled to the first driving power supply VDD, and the second electrode thereof is electrically coupled to a first electrode of the light emitting element LD. A gate electrode of the first transistor T1 is coupled to a first node N1. Here, the first electrode and the second electrode of the first transistor T1 may be different electrodes. For example, when the first electrode is a source electrode, the second electrode may be a drain electrode. The first transistor T1 controls an amount of a driving current supplied to the light emitting elements LD in response to a voltage of the first node N1.

A first electrode of the second transistor T2 (or switching transistor) is coupled to a data line DL, and a second electrode thereof is coupled to the first node N1. Here, the first electrode and the second electrode of the second transistor T2 may be different electrodes. For example, when the first electrode is a source electrode, the second electrode may be a drain electrode. A gate electrode of the second transistor T2 is coupled to a scan line SL.

When a scan signal of a voltage (e.g., a low voltage) at which the second transistor T2 can be turned on is supplied from the scan line SL, the second transistor T2 is turned on to electrically connect the data line DL and the first node N1. A data signal of the corresponding frame is supplied to the data line DL, and thus the data signal is transferred to the first node N1. The data signal transferred to the first node N1 is charged to the storage capacitor Cst.

One electrode of the storage capacitor Cst is coupled to the first driving power supply VDD, and the other electrode thereof is coupled to the first node N1. The storage capacitor Cst charges a voltage corresponding to the data signal supplied to the first node N1 and maintains the charged voltage until a data signal of the next frame is supplied.

For better understanding and ease of description, FIG. 2A shows the pixel driving circuit 144 having a relatively simple structure including a second transistor T2 for transferring the data signal into the sub-pixel SP, a storage capacitor Cst for storing the data signal, the first transistor T1 for supplying the driving current corresponding to the data signal to the light emitting element LD.

However, the present disclosure is not limited thereto, and the structure of the pixel driving circuit 144 may be variously modified. For example, the pixel driving circuit 144 may further include at least one transistor element such as a transistor element for compensating a threshold voltage of the first transistor T1, a transistor element for initializing the first node N1 and/or a transistor element for controlling emission time of the light emitting time of LD, and other circuit elements such as a boosting capacitor for boosting the voltage of the first node N1.

In addition, in FIG. 2A, all of the transistors, for example the first and second transistors T1 and T2 included in the pixel driving circuit 144 are shown to P-type transistors, but the present disclosure is not limited thereto. For example, at least one of the first and second transistors T1 and T2 included in the pixel driving circuit 144 may be changed to an N-type transistor.

Referring to FIG. 2B, according to an exemplary embodiment of the present disclosure, the first and second transistors T1 and T2 may be implemented as N-type transistors. The configuration or operation of the pixel driving circuit 144 shown in FIG. 2B is similar to that of the pixel driving circuit 144 of FIG. 2A except for a change of a connection position of some constituent elements due to a change of transistor type. Therefore, duplicative description thereof will not be repeated here.

Figure 3:
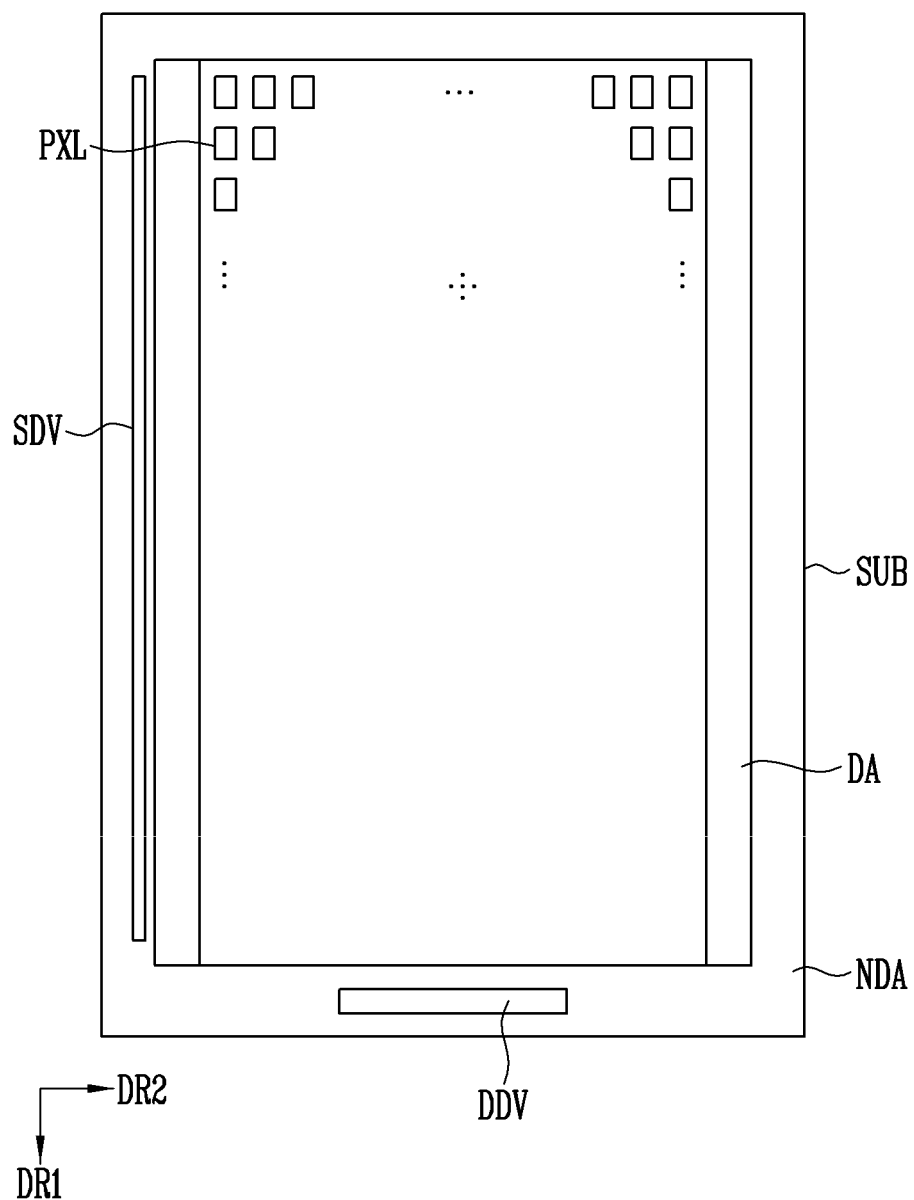
FIG. 3 is a top plan view showing a display device according to an exemplary embodiment of the present disclosure.

FIG. 3 is a top plan view showing a display device according to an exemplary embodiment of the present disclosure. As an example, FIG. 3 is a schematic top plan view of a display device using the light emitting element LD shown in FIG. 1A or 1B as a light emitting source.

Referring to FIGS. 1A, 1B and 3, a display device according to an exemplary embodiment of the present disclosure may include a substrate SUB, pixels PXL provided on one surface of the substrate SUB, a driver provided on the substrate SUB and driving the pixels PXL, and a line unit coupling the pixels PXL and the drivers.

The display device may be classified into a passive matrix display device and an active matrix display device according to a method of driving the light emitting element LD. For example, when the display device is implemented in an active matrix type, each pixel PXL may include a driving transistor for controlling the amount of current supplied to the light emitting element LD and a switching transistor for transferring a data signal to the driving transistor.

Recently, an active matrix display device which selects and lights each pixel PXL in terms of resolution, contrast, and operation speed has become a mainstream, but the present disclosure is not limited thereto, and a passive matrix display device in which lighting is performed for each group of the pixel PXL may be also used as constituent elements (e.g., first and second electrodes) for driving the light emitting element LD.

The substrate SUB may include a display area DA and a non-display area NDA. The display area DA may be an area where pixels PXL displaying an image is provided and may be referred to as an active area. In various exemplary embodiments, each of the pixels PXL may include at least one light emitting element LD. The light emitting element LD may be an organic light emitting diode or an ultra-small inorganic light emitting diode having a size in a micro to nano scale range, but the present disclosure is not limited thereto. The display device displays an image in the display area DA by driving pixels PXL in response to image data input from the outside.

The non-display area NDA may be an area around the display area DA and may be referred to as a non-active area. In various exemplary embodiments, the non-display area NDA may mean the entire area of the substrate SUB except for the display area DA. As shown in FIG. 3, the non-display area NDA may be provided in a form surrounding the display area DA.

The non-display area NDA may be an area where a driver for driving the pixels PXL and a portion of a line unit coupling the drivers with the pixels PXL are provided.

The pixels PXL may be provided in the display area DA on the substrate SUB. Each of the pixels PXL may be provided in plural as a unit for displaying an image. The pixels PXL may include a light emitting element LD that emits white light and/or color light. Each pixel PXL may emit one of red, green and/or blue colors, but the present disclosure is not limited thereto. For example, each pixel PXL may emit one of cyan, magenta, yellow and white.

A plurality of pixels PXL may be provided in a matrix form along a column extending in the first direction DR1 and a row extending in the second direction DR2 crossing the first direction DR1. However, an arrangement form of the pixels PXL is not particularly limited and may be arranged in various suitable forms.

The driver may provide a signal to each pixel PXL through a line unit, thereby controlling the driving of the pixel PXL. In FIG. 3, the line unit is omitted for better understanding and ease of description.

The driver may include a scan driver SDV that provides a scan signal to the pixels PXL through a scan line, a light emission driver that provides a light emission control signal to the pixels PXL through a light emission control line, a data driver DDV that provides a data signal to the pixels PXL through the data line, and a timing controller. The timing controller may control the scan driver SDV, the light emission driver, and the data driver DDV.

A display device according to an exemplary embodiment of the present disclosure may be applied to various suitable electronic devices. For example, the display device may be applied to a TV, a laptop, a mobile phone, a smart phone, a smart pad (PD), a PMP, a PDA, a navigation system, various wearable suitable devices such as a smart watch, and the like.

Figure 4:
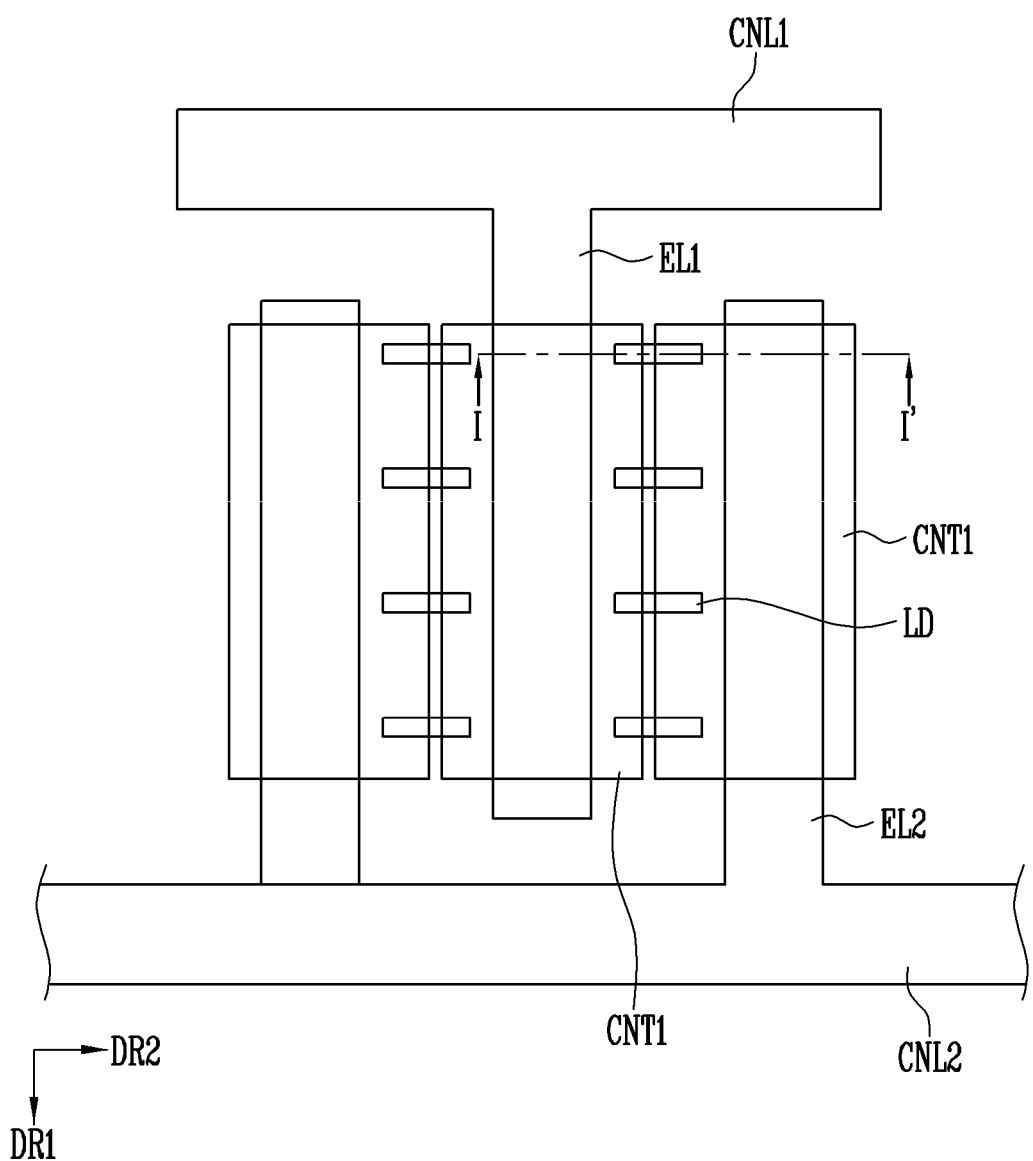
FIG. 4 is a top plan view schematically showing a display element layer according to an exemplary embodiment of the present disclosure.

FIG. 4 is a top plan view schematically showing a display element layer according to an exemplary embodiment of the present disclosure. As an example, FIG. 4 schematically shows first and second electrodes EL1 and EL2, light emitting elements LD, first and second contact electrodes CNT1 and CNT2 included in the display element layer according to an exemplary embodiment of the present disclosure. For better comprehension and ease of description, first and second banks, grooves and a first reflective layer included in the display element layer, are not separately shown in FIG. 4.

Figure 5A:
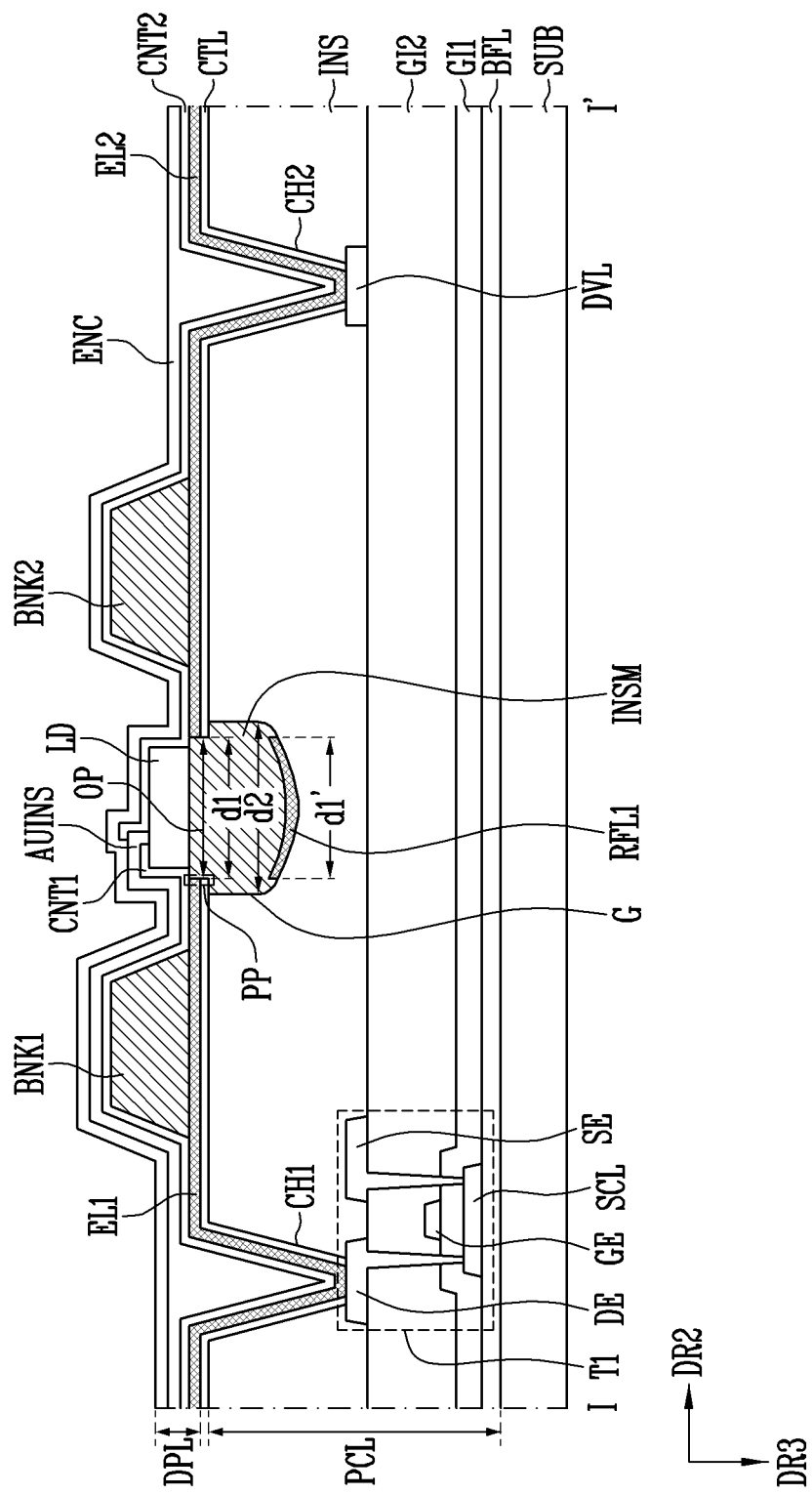
FIG. 5A is a cross-sectional view showing an exemplary embodiment of a display device taken along a line I-I' of FIG. 4.

FIG. 5A is a cross-sectional view showing an exemplary embodiment of a display device taken along a line I-I' of FIG. 4. For better comprehension and ease of description, a second transistor included in the pixel circuit layer PCL is not separately shown in FIG. 5A.

As shown in FIGS. 4 and 5A, a display device according to an exemplary embodiment of the present disclosure may include a substrate SUB, a pixel circuit layer PCL, and a display element layer DPL.

The substrate SUB may be a rigid substrate or a flexible substrate.

The rigid substrate may include a glass substrate, a quartz substrate, a glass ceramic substrate, and/or a crystalline glass substrate.

The flexible substrate may include a film substrate including polymeric organic materials and/or a plastic substrate. For example, the flexible substrate may include at least one selected from the group consisting of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). In addition, the flexible substrate may include fiberglass reinforced plastic (FRP).

The material to be applied to the substrate SUB may have resistance (e.g., heat resistance) against a high processing temperature in the manufacturing process of the display device. In an exemplary embodiment of the present disclosure, the substrate SUB may be entirely or partially flexible (e.g., a portion of the substrate SUB or the entire substrate SUB may be flexible).

Referring to FIGS. 2A to 5A, the pixel circuit layer PCL may include a buffer layer BFL, a first transistor T1, a second transistor T2 (see FIGS. 2A and 2B), a driving voltage line DVL, and an insulation layer INS. In addition, the pixel circuit layer PCL may include a plurality of insulation layers.

A buffer layer BFL may be provided on one surface of the substrate SUB. The buffer layer BFL can prevent or reduce spreading of impurities to the first and second transistors T1 and T2. The buffer layer BFL may include an inorganic insulation layer including an inorganic material. For example, the buffer layer BFL may include at least one of metal oxides such as silicon nitride (SiNx), silicon oxide (SiOx), silicon oxynitride (SiON), and AlOx.

The buffer layer BFL may be provided as a single layer, but may also be provided as multiple layers of at least two or more layers. When the buffer layer BFL is provided in multiple layers, each layer may be formed of the same material or different materials. The buffer layer BFL may be omitted according to the material and process conditions of the substrate SUB.

The first transistor T1 may be a driving transistor which is electrically coupled to the light emitting element LD to drive the light emitting element LD. The second transistor T2 may be a switching transistor which is electrically coupled to the first transistor T1 to switch the first transistor T1.

Each of the first transistor T1 and the second transistor T2 may include a semiconductor layer SCL, a gate electrode GE, a source electrode SE, and a drain electrode DE.

The semiconductor layer SCL of the transistors T1 and T2 may be provided on the buffer layer BFL. The semiconductor layer SCL may include a source region and a drain region contacting (e.g., physically contacting) the corresponding source electrode SE and drain electrode DE, respectively. A region between the source region and the drain region may be a channel region. The semiconductor layer SCL may be a semiconductor pattern made of polysilicon, amorphous silicon, oxide semiconductor, and/or the like. The channel region may be a semiconductor pattern doped with impurity. The impurity may include impurity such as n-type impurity, p-type impurity, and other metals.

The gate electrode GE of the transistors T1 and T2 may be provided on the corresponding semiconductor layer SCL with a first gate insulation layer GI1 interposed therebetween.

Each of the source electrode SE and the drain electrode DE included in the first transistor T1 may be coupled to the corresponding source region and the corresponding drain region of the semiconductor layer SCL through a contact hole passing through a second gate insulation layer GI2 and the first gate insulation layer GI1.

Each of the source electrode and the drain electrode included in the second transistor T2 may be coupled to the corresponding source region and the corresponding drain region of the semiconductor layer SCL through a contact hole passing through the second gate insulation layer GI2 and the first gate insulation layer GI1.

In addition, a case where the transistors T1 and T2 are thin film transistors having a top gate structure is described as an exemplary embodiment, but the present disclosure is but the present disclosure is not limited thereto. According to an exemplary embodiment, the transistors T1 and T2 may be thin film transistors having a bottom gate structure.

The driving voltage line DVL may be provided on the second gate insulation layer GI2, but a position of the driving voltage line DVL is not limited thereto. The driving voltage line DVL may be coupled to a power line to which the second driving power supply VSS (see FIGS. 2A and 2B) is applied. Accordingly, the second driving power supply VSS may be supplied to the driving voltage line DVL by the power line. However, the present disclosure is not limited thereto, and a signal corresponding to the driving voltage may be directly supplied from the driver to the driving voltage line DVL according to an exemplary embodiment.

The pixel circuit layer PCL may further include an insulation layer INS covering the first and second transistors T1 and T2 and the driving voltage line DVL.

The insulation layer INS may include an organic insulation layer, and/or an inorganic insulation layer. Here, the inorganic insulation layer may include at least one of metal oxides such as silicon oxide (SiOx), silicon nitride (SiNx), silicon nitride (SiON), and/or AlOx.

The organic insulation layer may include an organic insulation material. The organic insulation layer may include at least one selected from, for example, polyacrylates resins, epoxy resins, phenolic resins, polyamides resins, and polyimide resins, unsaturated polyesters resin, poly-phenylene ethers resin, poly-phenylene sulfides resin, and benzocyclobutene resin.

In various exemplary embodiments of the present disclosure, the insulation layer INS may be made of an inorganic insulation layer which is beneficial or advantageous for protecting the light emitting elements LD from the pixel circuit layer PCL of each pixel PXL, but the present disclosure is but not limited thereto. According to an exemplary embodiment, the insulation layer INS may be made of an organic insulation layer which is beneficial or advantageous for flattening a supporting surface of the intermediate layer CTL and the first and second electrodes EL1 and EL2.

In various exemplary embodiments of the present disclosure, the insulation layer INS may include a groove G concave in a direction toward the substrate SUB (e.g., third direction DR3). For example, the groove G may have a concave shape in the direction from the surface of the insulation layer INS toward the substrate SUB, and a lower surface of the groove G may be spaced apart from a lower surface of the insulation layer INS. For example, the groove G may not pass through the insulation layer INS. In some embodiments, the groove G may be formed in the insulation layer INS such that the concave portion of the groove G protrudes toward the lower surface of the insulation layer INS (e.g., protrudes toward the substrate SUB).

Figure 5B:
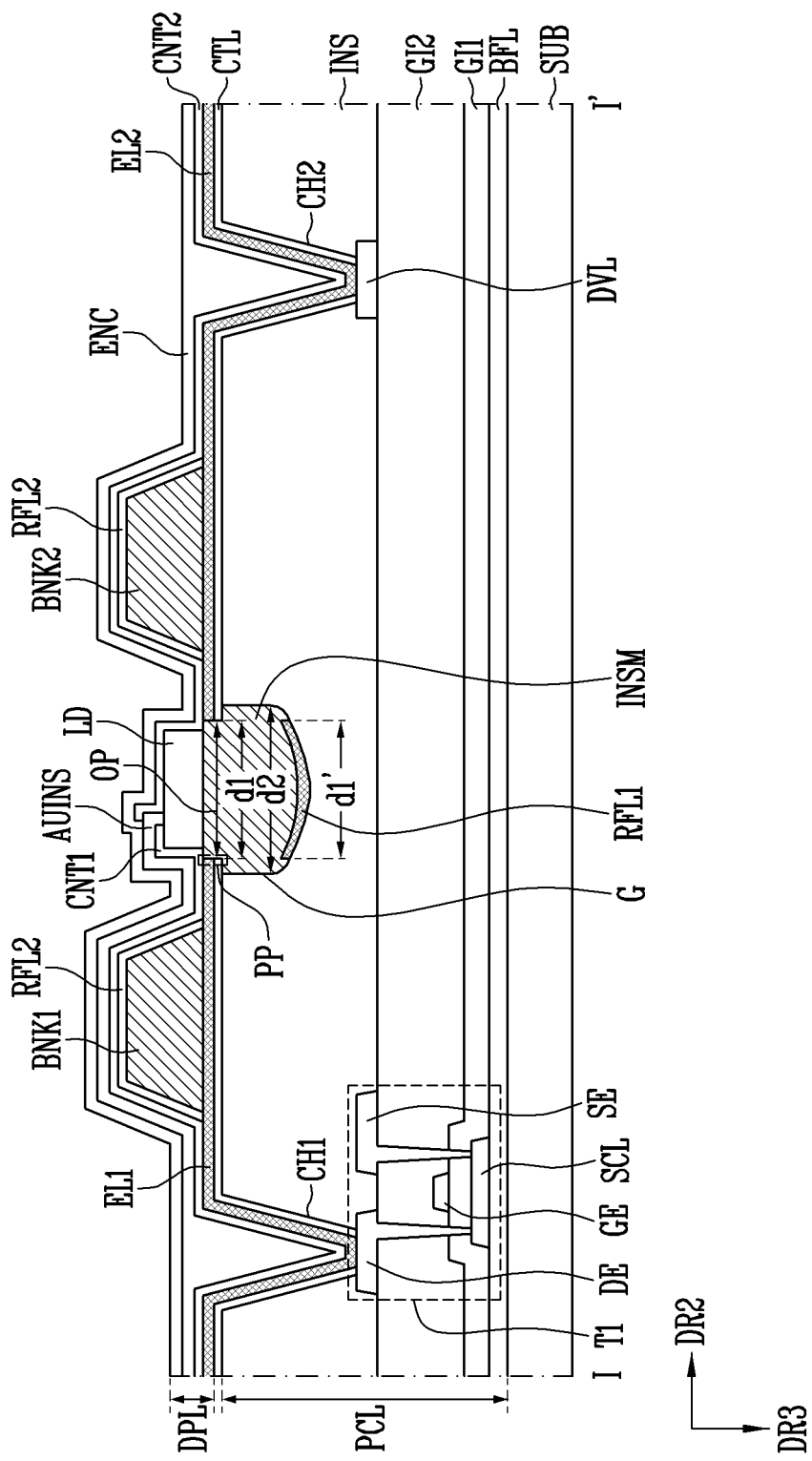
FIG. 5B is a cross-sectional view showing another exemplary embodiment of a display device taken along a line I-I' of FIG. 4.

In various exemplary embodiments of the present disclosure, the display device may include a first reflective layer RFL1 that is on at least a portion of the insulation layer INS. In more detail, the first reflective layer RFL1 may be on the groove G. As shown in FIGS. 5A and 5B, a first reflective layer RFL1 may be provided on one surface of the groove G facing the light emitting element LD. For example, the first reflective layer RFL1 may overlap the light emitting element LD. The first reflective layer RFL1 is on the groove G, and thus, the luminous efficiency of the light emitting element LD may be improved.

The pixel circuit layer PCL may further include a protective layer that is on the insulation layer INS. The protective layer may be provided in a form including an organic insulation layer, an inorganic insulation layer, or the organic insulation layer on the inorganic insulation layer.

Referring to FIGS. 3 to 5A, the display element layer DPL may be on the insulation layer INS and the first reflective layer RFL1. The display element layer DPL may include an intermediate layer CTL, first and second electrodes EL1 and EL2, first and second banks BNK1 and BNK2, a light emitting element LD, first and second contact electrodes CNT1 and CNT2. In addition, the display element layer DPL may include an auxiliary insulation layer AUINS.

The first electrode EL1 may extend in the first direction DR1, and may be electrically coupled to the light emitting element LD. The second electrode EL2 may be spaced apart from the first electrode EL1 in the second direction DR2 different from the first direction DR1, and may be electrically coupled to the light emitting element LD.

Referring to FIG. 4, the first electrode EL1 may be coupled to the first connection line CNL1 or may be integrally formed with the first connection line CNL1. The first connection line CNL1 may be electrically coupled to the first power supply VDD (see FIGS. 2A and 2B) described above.

The second electrode EL2 may be coupled to the second connection line CNL2 or may be integrally formed with the second connection line CNL2. The second connection line CNL2 may be electrically coupled to the second power supply VSS (see FIGS. 2A and 2B) described above.

As shown in FIG. 5A, each of the first electrode EL1 and the second electrode EL2 may include a portion PP (hereinafter, protruded portion) overlapping a portion of the groove G. Accordingly, a distance d1 between the first electrode EL1 and the second electrode EL2 in the second direction DR2 may be less than a width d2 of the groove G in the second direction DR2. By setting the distance d1 between the first electrode EL1 and the second electrode EL2 smaller than the width d2 of the groove G, the light emitted from the light emitting element LD may be effectively induced in the upward direction (e.g., front direction) with respect to the third direction DR3.

In various exemplary embodiments of the present disclosure, the distance d1 between the first electrode EL1 and the second electrode EL2 in the second direction DR2 may be the same or substantially the same as the width d1' of the first reflective layer RFL1 in the second direction DR2. Referring to FIG. 5A, with respect to the third direction DR3, the protruded portion PP of the first and second electrodes EL1 and EL2 and one end of the first reflective layer RFL1 may be located at the same line.

The first reflective layer RFL1 may be spaced apart from the first and second electrodes EL1 and EL2. For example, the first reflective layer RFL1 may be electrically insulated with the first and second electrodes EL1 and EL2.

In various exemplary embodiments of the present disclosure, the first and second electrodes EL1 and EL2 and the first reflective layer RFL1 may function as reflective members that improve luminous efficiency of the light emitting elements LD by directing the light emitted from light emitting elements LD to the front direction (e.g., image display direction) of the display device.

The first and second electrodes EL1 and EL2 and the first reflective layer RFL1 may include a conductive material having high light reflectance. The conductive material having the high light reflectance may include, for example, metals such as Ag, Mg, Al, Pt, Pd, Au, Ni, Nd, Ir, Cr, Ti, and/or alloys thereof.

In various exemplary embodiments of the present disclosure, the first and second electrodes EL1 and EL2 and the first reflective layer RFL1 may include the same or substantially the same metallic material. The first and second electrodes EL1 and EL2 and the first reflective layer RFL1 may be formed in the same or substantially the same process.

According to an exemplary embodiment, each of the first and second electrodes EL1 and EL2 may include a transparent conductive material. The transparent conductive material may include a conductive oxide such as indium tin oxide (ITO), indium zinc oxide (IZO), zinc oxide (ZnO), indium tin zinc oxide (ITZO), conductive polymer such as PEDOT, and/or the like. When each of the first and second electrodes EL1 and EL2 includes a transparent conductive material, a separate conductive layer made of an opaque metal may be additionally included to reflect the light emitted from the light emitting element LD in the front direction (e.g., image display direction) of the display device. However, each material of the first and second electrodes EL1 and EL2 is not limited to the materials described above. The first reflective layer RFL1 may include the same or substantially the same metallic material as the conductive layer further formed on the first and second electrodes EL1 and EL2.

In various exemplary embodiments of the present disclosure, the intermediate layer CTL may be between the first electrode EL1 and the insulation layer INS and between the second electrode EL2 and the insulation layer INS. As shown in FIG. 5A, the intermediate layer CTL may include an opening OP overlapping the groove G.

The intermediate layer CTL may include an organic insulation layer and/or an inorganic insulation layer. Here, the inorganic insulation layer may include at least one of metal oxides such as silicon oxide (SiOx), silicon nitride (SiNx), silicon nitride (SiON), and/or AlOx.

The organic insulation layer may include an organic insulation material. The organic insulation layer may include at least one of, for example, polyacrylates resins, epoxy resins, phenolic resins, polyamides resins, and polyimide resins, unsaturated polyesters resin, poly-phenylene ethers resin, poly-phenylene sulfides resin, and/or benzocyclobutene resin.

The insulation layer INS and the intermediate layer CTL may be formed of different materials from each other. For example, the insulation layer INS may include an organic insulation layer, and the intermediate layer CTL may include an inorganic insulation layer. In some embodiments, the inorganic insulation material included in the insulation layer INS and the inorganic insulation material included in the intermediate layer CTL may be different from each other.

The distance d1 between the first electrode EL1 and the second electrode EL2 in the second direction DR2 may be the same or substantially the same as the width d1 of the opening OP in the second direction DR2. In addition, the width d1 of the opening OP in the second direction DR2 may be less than the width d2 of the groove G in the second direction DR2.

Referring to FIG. 5A, as the opening OP is formed in the intermediate layer CTL, the intermediate layer CTL may include a portion PP (hereinafter, protruded portion) overlapping a portion of the groove G. With respect to the third direction DR3, the protruded portion PP of the intermediate layer CTL and the protruded portion PP of the first and second electrodes EL1 and EL2 may be located at the same line. In addition, the protruded portion PP of the intermediate layer CTL and one end of the first reflective layer RFL1 may be located at the same line. For example, the width d1 of the opening OP in the second direction DR2 may be the same or substantially the same as the width d1' of the first reflective layer RFL1 in the second direction DR2.

In various exemplary embodiments of the present disclosure, the groove G may be filled with insulation material INSM, and the light emitting element LD may be on the insulation material INSM. For example, the insulation material INSM may be filled in the groove G in which the first reflective layer RFL1 is formed.

The insulation material INSM may include an inorganic insulation material and/or an organic insulation material. Here, the inorganic insulation material may include at least one of metal oxides such as silicon oxide (SiOx), silicon nitride (SiNx), silicon nitride (SiON), and/or AlOx. The organic insulation material may include at least one selected from, for example, polyacrylates resins, epoxy resins, phenolic resins, polyamides resins, and polyimide resins, unsaturated polyesters resin, poly-phenylene ethers resin, poly-phenylene sulfides resin and benzocyclobutene resin.

In various exemplary embodiments of the present disclosure, the insulation material INSM filled in the groove G may form a flat surface with the first and second electrodes EL1 and EL2. As shown in FIG. 5A, the insulation material INSM may be filled in the groove G, in the opening OP of the intermediate layer CTL, and between the first and second electrodes EL1 and EL2 to form a flat surface with the first and second electrodes EL1 and EL2. Accordingly, the light emitting element LD can be on a surface of a flat insulation material INSM.

In various exemplary embodiments of the present disclosure, the display element layer DPL may include first and second banks BNK1 and BNK2. The first bank BNK1 may be provided on the first electrode EL1, and may extend in the first direction DR1. The second bank BNK2 may be provided on the second electrode EL2, and may extend in the first direction DR1. The first bank BNK1 and the second bank BNK2 may be spaced apart from each other in the second direction DR2, and may partition the unit light emitting areas.

Two banks BNK1 and BNK2 adjacent to each other may be spaced apart in a second direction DR2. For example, the two first and second banks BNK1 and BNK2 adjacent to each other may be spaced more than a length of the light emitting element LD.

The first and second banks BNK1 and BNK2 may include an inorganic insulation layer made of an inorganic material and/or an organic insulation layer made of an organic material. According to an exemplary embodiment, the first and second banks BNK1 and BNK2 may include a single layer of an organic insulation layer and/or a single layer of an inorganic insulation layer, but the present disclosure is not limited thereto. According to an exemplary embodiment, the first and second banks BNK1 and BNK2 may be provided in a form of multiple layers in which at least at least one organic insulation layer and at least one inorganic insulation layer are stacked. However, the material of the first and second banks BNK1 and BNK2 are not limited to the exemplary embodiments described above, and according to the exemplary embodiment, the first and second banks BNK1 and BNK2 may include a conductive material (e.g., and electrically conductive and/or heat conductive material).

As shown in FIG. 5A, the first and second banks BNK1 and BNK2 may have a cross section of a trapezoid that becomes narrower upwards in the third direction DR3 (e.g., becomes narrower along a direction away from the substrate SUB), but the present disclosure is not limited thereto. As another example, the first and second banks BNK1 and BNK2 may have a curved surface having a cross section such as a semi-circle or semi-ellipse that becomes narrower upwards (e.g., becomes narrower along a direction away from the substrate SUB). In the present disclosure, the shape and/or the inclination of the first and second banks BNK1 and BNK2 are not particularly limited, and may be variously changed.

In some embodiments, a bank pattern may be provided in a peripheral area of the pixel area of each pixel PXL.

The bank pattern may surround at least one side of the peripheral area included in the pixel area of each pixel PXL. The bank pattern is a structure defining (or partitioning) a light emitting area of each pixel PXL and each of adjacent pixels PXL, and may be, for example, a pixel definition layer. This bank pattern may be configured to include at least one shading material and/or reflective material to prevent or reduce light leakage defects where light leaks between each pixel PXL and adjacent pixels PXL. According to an exemplary embodiment, a reflective material layer may be formed on the bank pattern to further improve the efficiency of the light emitted from each pixel PXL. The bank pattern may be formed on a different layer from or on the same layer as the first and second banks BNK1 and BNK2, according to an exemplary embodiment.

The first contact electrode CNT1 may be on the first electrode EL1, and may electrically connect the first electrode EL1 with the light emitting element LD. The second contact electrode CNT2 may be on the second electrode EL2, and may electrically connect the second electrode EL2 with the light emitting element LD.

Referring to FIG. 5A, the first contact electrode CNT1 may be on the first electrode EL1 and the first bank BNK1, and the second contact electrode CNT2 may be on the second electrode EL2 and the second bank BNK2.

In some embodiments, the first contact electrode CNT1 may have a shape corresponding to the inclination of the first bank BNK1, and the second contact electrode CNT2 may have a shape corresponding to the inclination of the second bank BNK2. For example, the first contact electrode CNT1 may include a protruded portion corresponding to the first bank BNK1 and a flat portion corresponding to the first electrode EL1, and the second contact electrode CNT2 may include a protruded portion corresponding to the second bank BNK2 and a flat portion corresponding to the second electrode EL2.

The first and second contact electrodes CNT1 and CNT2 may include at least one of various suitable transparent conductive materials, including ITO, IZO and ITZO, and may be implemented to be substantially transparent or translucent to satisfy or achieve a set or predetermined transmittance (e.g., transmittance of visible light). For example, the first and second contact electrodes CNT1 and CNT2 may be made of a transparent conductive material so that light emitted from the light emitting element LD may be transmitted without loss or substantially without loss. However, the material of the first and second contact electrodes CNT1 and CNT2 is not limited to the exemplary embodiments described above.

One end of the light emitting element LD on the insulation material INSM may contact (e.g., physically contact) the first contact electrode CNT1. An auxiliary insulation layer AUINS covering the first contact electrode CNT1 may be on the first contact electrode CNT1. The auxiliary insulation layer AUINS may be an inorganic insulation layer including an inorganic material or an organic insulation layer including an organic material.

The other end of the light emitting element LD on the insulation material INSM may contact (e.g., physically contact) the second contact electrode CNT2. As shown in FIG. 5A, the second contact electrode CNT2 may be on a portion of the light emitting element LD exposed by the auxiliary insulation layer AUINS and the auxiliary insulation layer AUINS. The first and second contact electrodes CNT1 and CNT2 may be spaced apart from each other by the auxiliary insulation layer AU INS.

In various exemplary embodiments of the present disclosure, one of the first and second electrodes EL1 and EL2 may be electrically coupled to at least one of a plurality of transistors included in the pixel circuit layer PCL.

For example, the first electrode EL1 may be electrically coupled to the drain electrode DE of the first transistor T1 through the first contact hole CH1 passing through the insulation layer INS. The source electrode SE of the first transistor T1 may be electrically coupled to the power line to which the first power supply VDD (see FIGS. 2A and 2B) is applied. Accordingly, the first electrode EL1 may receive a signal (e.g., first power supply VDD) from the first transistor T1.

The second electrode EL2 may be electrically coupled to the driving voltage line DVL through the second contact hole CH2 passing through the insulation layer INS. The second power supply VSS may be applied to the driving voltage line DVL. Accordingly, the second electrode EL2 may receive a signal (e.g., second power supply VSS) from the driving voltage line DVL.

One end of the light emitting element LD may contact (e.g., physically contact) the first contact electrode CNT1, and the other end of the light emitting element LD2 may be contacted with the second contact electrode CNT2. In addition, the first contact electrode CNT1 may be electrically coupled to the first electrode EL1, and the second contact electrode CNT2 may be electrically coupled to the second electrode EL2.

Accordingly, the light emitting element LD may receive a set or predetermined voltage through the first electrode EL1 and the second electrode EL2. When an electric field of more than a set or predetermined voltage is applied to both ends of the light emitting element LD, the light emitting element LD emits light while electron-hole pairs are coupled in the active layer 12 of the light emitting element LD. For example, the first and second contact electrodes CNT1 and CNT2 may function as driving electrodes for driving the light emitting elements LD.

In addition, as the first contact electrode CNT1 is coupled to the first electrode EL1 and the second contact electrode CNT2 is coupled to the second electrode EL2, line resistance of each of the first and second contact electrodes CNT1 and CNT2 may be reduced, thereby minimizing or reducing driving failure of the light emitting element LD due to a signal delay.

When the light emitting element LD emits light, the light may be emitted from both ends of the light emitting element LD in the second direction DR2, and may be emitted from the top and bottom of the light emitting element LD in the third direction DR3. The light emitted from both ends of the light emitting element LD may be reflected by the first and second electrodes EL1 and EL2 to be induced in the upward direction (e.g., front direction) with respect to the third direction DR3. In addition, the light emitted from the bottom of the light emitting element LD may be reflected by the first reflective layer RFL1 to be induced upward direction (e.g., front direction) with respect to the third direction DR3.

According to various embodiments of the present disclosure, by providing the first reflective layer RFL1 overlapping the light emitting element LD in the groove G, when the light emitting device LD emits light, the light emitted from the bottom of the light emitting device LD may be induced toward the front direction of the display device, thereby improving luminous efficiency of the display device.

In various exemplary embodiments of the present disclosure, the display element layer DPL may include an encapsulation layer ENC provided on one surface of the insulation layer INS on which the intermediate layer CTL, the first and second electrodes EL1 and EL2, the first and second contact electrodes CNT1 and CNT2, and the light emitting elements LD are located. The encapsulation layer ENC covers the first and second electrodes EL1 and EL2, the first and second contact electrodes CNT1 and CNT2, and the light emitting elements LD so that they may be not exposed to the outside, thereby preventing or reducing corrosion of the first and second electrodes EL1 and EL2, the first and second contact electrodes CNT1 and CNT2, and/or the light emitting elements LD.

The encapsulation layer ENC may include a transparent insulation material, thereby transmitting light. The transparent insulation material may include an organic material or an inorganic material. For example, the encapsulation layer ENC may be formed of a transparent insulation material to minimize or reduce the loss of light emitted from the light emitting elements LD and reflected to the image display direction of the display device by the first and second electrodes EL1 and EL2, and the first reflective layer RFL1.

In various exemplary embodiments of the present disclosure, an overcoat layer may be provided on the encapsulation layer ENC. The overcoat layer may be an encapsulation layer that prevents or reduces penetration of oxygen and moisture into the light emitting elements LD.

In addition, the overcoat layer may be a planarization layer for alleviating steps caused by the configurations located thereunder, for example, the light emitting elements LD, the first and second banks BNK1 and BNK2, the first and second electrodes EL1 and EL2, the first and second contact electrodes CNT1 and CNT2, and the like.

In various exemplary embodiments of the present disclosure, the intermediate layer CTL, the first and second banks BNK1 and BNK2, the first and second electrodes EL1 and EL2, the light emitting elements LD, the first and second contact electrodes CNT1 and CNT2 described above may be provided in each of the pixels PXL.

FIG. 5B is a cross-sectional view showing another exemplary embodiment of a display device taken along a line I-I' of FIG. 4. For better comprehension and ease of description, the second transistor included in the pixel circuit layer PCL is not separately shown in FIG. 5B.

In the display device according to an exemplary embodiment of the present disclosure, a configuration not mentioned in the display device according to the exemplary embodiment described above will be mainly described in order to avoid duplicate explanation. Parts not particularly described in the exemplary embodiment of the present disclosure refer to an exemplary embodiment described above, the same number represents the same constituent element, and the similar number represents a similar constituent element. This is also true for an exemplary embodiment described below.

As shown in FIGS. 4 and 5B, a display device according to an exemplary embodiment of the present disclosure may include a substrate SUB, a pixel circuit layer PCL, and a display element layer DPL.

In an exemplary embodiment of the present disclosure, the display element layer DPL may further include a second reflective layer RFL2 on the first and second banks BNK1 and BNK2. The second reflective layer RFL2 may have a shape corresponding to the inclination of the first and second banks BNK1 and BNK2. For example, the second reflective layer RFL2 may include a protruded portion corresponding to the first and second banks BNK1 and BNK2 and a flat portion corresponding to the first and second electrodes EL1 and EL2.

The first and second banks BNK1 and BNK2, and the second reflective layer RFL2 may function as a reflective member to improve the luminous efficiency of the display device by inducing the light emitted from the light emitting elements LD in the desired direction. For example, the first and second banks BNK1 and BNK2, and the second reflective layer RFL2 may function as a reflective member to improve luminous efficiency of the light emitting elements LD by directing the light emitted from the light emitting elements LD to the front direction (e.g., image display direction) of the display device. For example, the light emitted from both ends of the light emitting element LD may be reflected by the first and second electrodes EL1 and EL2 and the second reflective layer RFL2 to be induced in the upward direction (e.g., front direction) with respect to the third direction DR3.

The second reflective layer RFL2 may include a conductive material with high light reflectance. The conductive material with the high light reflectance may include, for example, metals such as Ag, Mg, Al, Pt, Pd, Au, Ni, Nd, Ir, Cr, Ti, and/or alloys thereof.

The first contact electrode CNT1 may be on the first bank BNK1 with the second reflective layer RFL2 interposed therebetween, and the second contact electrode CNT2 may be on the second bank BNK2 with the second reflective layer RFL2 interposed therebetween.

Figure 6:
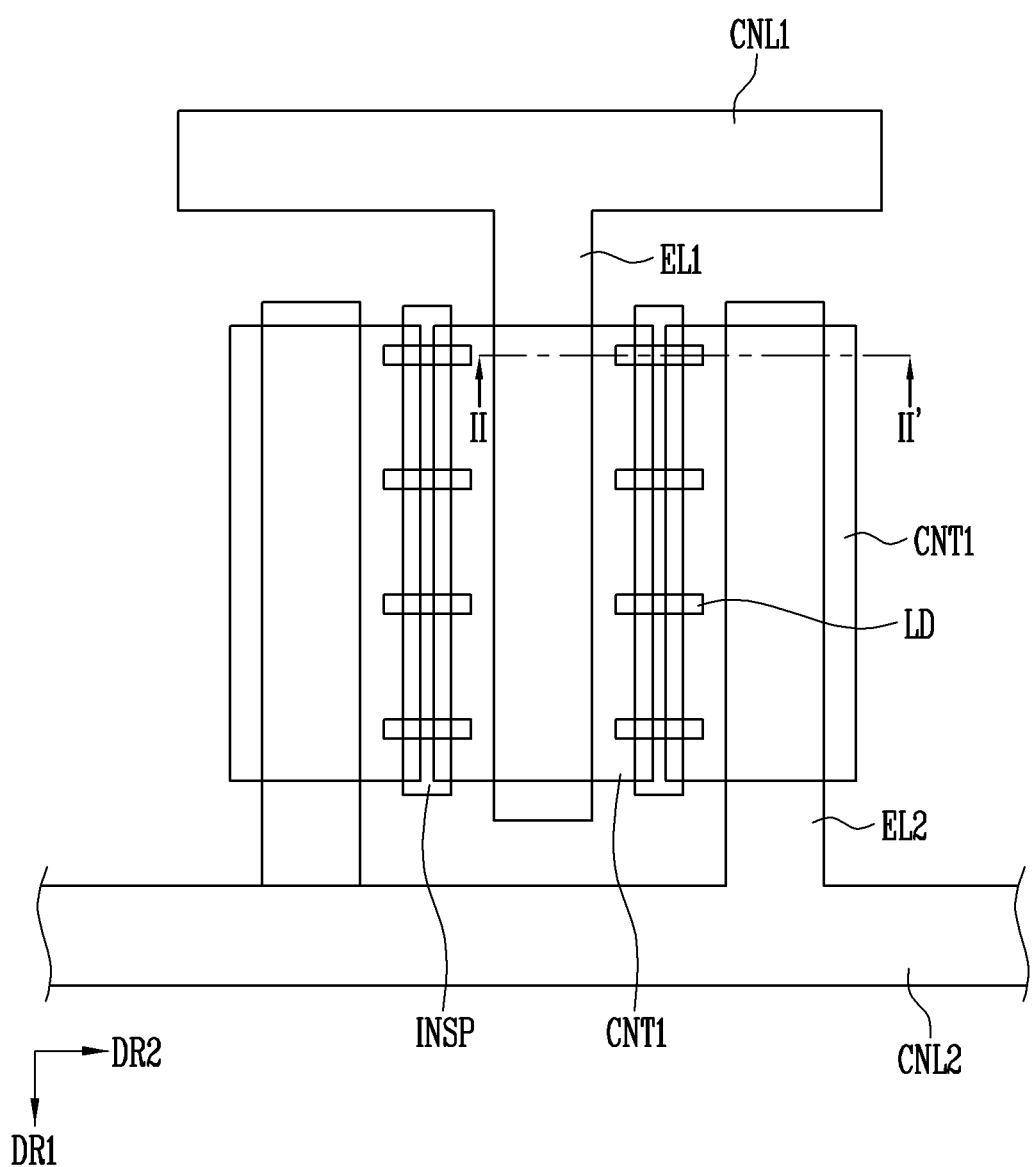
FIG. 6 is a top plan view schematically showing a display element layer according to another exemplary embodiment of the present disclosure.

FIG. 6 is a top plan view schematically showing a display element layer according to another exemplary embodiment of the present disclosure. As an example, FIG. 6 schematically shows the first and second electrodes EL1 and EL2, the light emitting elements LD, the first and second contact electrodes CNT1 and CNT2 included in the display element layer according to another exemplary embodiment of the present disclosure. For better comprehension and ease of description, the first and second banks, the groove and the first reflective layer included in the display element layer are not separately shown in FIG. 6.

Figure 7:
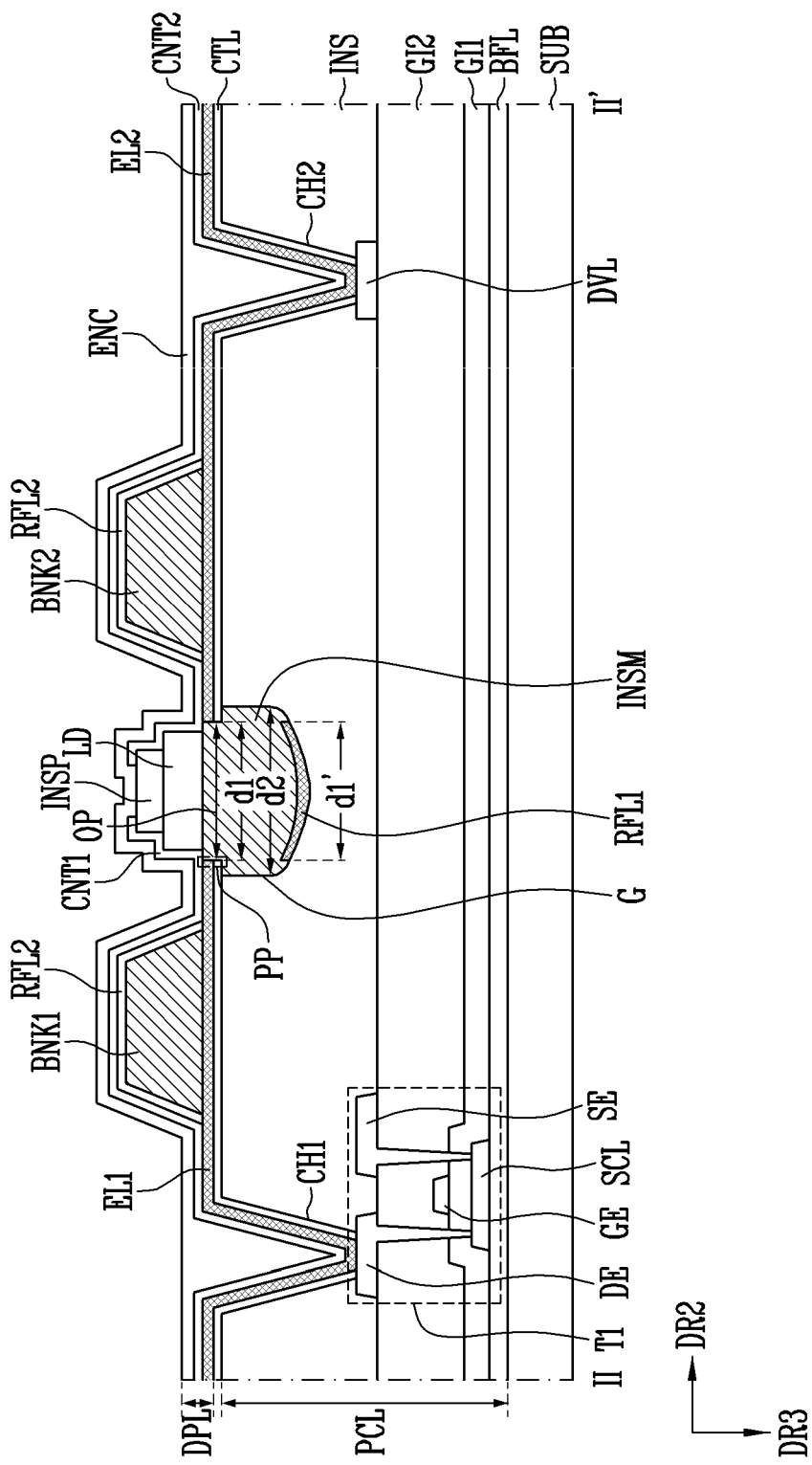
FIG. 7 is a cross-sectional view showing an exemplary embodiment of a display device taken along a line II-II' of FIG. 6.

FIG. 7 is a cross-sectional view showing an exemplary embodiment of a display device taken along a line II-II' of FIG. 6. For better comprehension and ease of description, the second transistor included in the pixel circuit layer PCL is not separately shown in FIG. 7.

As shown in FIGS. 6 and 7, a display device according to an exemplary embodiment of the present disclosure may include a substrate SUB, a pixel circuit layer PCL and a display element layer DPL.

Referring to FIGS. 6 and 7, the display element layer DPL may include an insulation pattern INSP provided on the light emitting elements LD. The insulation pattern INSP can prevent or reduce movement of the light emitting elements LD provided between the first and second electrodes EL1 and EL2 from the aligned position.

The insulation pattern INSP may be provided in a form extending in the first direction DR1. The insulation pattern INSP may overlap a portion of the light emitting elements LD to expose one end and the other end of the light emitting elements LD. The insulation pattern INSP may be made of a transparent insulation material so that the light emitted from the light emitting elements LD may be transmitted without loss.

The insulation pattern INSP may be composed of a single layer or multiple layers, and may include an inorganic insulation layer including at least one inorganic material and/or may include an organic insulation layer including at least one organic material. The insulation pattern INSP can further fix each of the light emitting elements LD arranged in the light emitting area of each pixel PXL.

In an exemplary embodiment of the present disclosure, the insulation pattern INSP may include an inorganic insulation layer which is beneficial or advantageous for protecting the active layer 12 in each of the light emitting elements LD from external oxygen and moisture. However, the present disclosure is not limited thereto. The insulation pattern INSP may include an organic insulation layer including an organic material according to the design conditions of the display device to which the light emitting elements LD is applied.

As shown in FIG. 7, the first contact electrode CNT1 may be provided at one end of the light emitting element LD exposed by the insulation pattern INSP, and the second contact electrode CNT2 may be provided at the other end thereof. In addition, the first and second contact electrodes CNT1 and CNT2 may be provided on a portion of the insulation pattern INSP. The first contact electrode CNT1 and the second contact electrode CNT2 may be spaced apart from each other on the insulation pattern INSP. As the first and second contact electrodes CNT1 and CNT2 are provided on a portion of the insulation pattern INSP, the position of the light emitting elements LD aligned between the first and second electrodes EL1 and EL2 can be more stably fixed.

FIGS. 8A to 8L are cross-sectional views sequentially showing a manufacturing method of a display device according to an exemplary embodiment of the present disclosure. As an example, FIGS. 8A to 8L are cross-sectional views sequentially showing the manufacturing methods of the display device according to an exemplary embodiment of the present disclosure shown in FIG. 5B. For better comprehension and ease of description, the second transistor included in the pixel circuit layer PCL is not separately shown in FIGS. 8A to 8L.

Referring to FIGS. 1A to 4, 5B and 8A, a first transistor T1, a driving voltage line DVL, an insulation layer INS and at least one insulation layer are formed on the substrate SUB. Here, the at least one insulation layer may include a buffer layer BFL, a first gate insulation layer GI1 and a second gate insulation layer GI22 sequentially formed on the substrate SUB.

A first contact hole CH1 exposing a portion of the drain electrode DE of the first transistor T1 and a second contact hole CH2 exposing a portion of the driving voltage line DVL may be formed in the insulation layer INS.

The insulation layer INS may be provided in a form including an organic insulation layer, and/or an inorganic insulation layer. Here, the inorganic insulation layer may include at least one of metal oxides such as silicon oxide (SiOx), silicon nitride (SiNx), silicon nitride (SiON), and/or AlOx.

The organic insulation layer may include an organic insulation material. The organic insulation layer may include at least one selected from, for example, polyacrylates resins, epoxy resins, phenolic resins, polyamides resins, and polyimide resins, unsaturated polyesters resin, poly-phenylene ethers resin, poly-phenylene sulfides resin, and benzocyclobutene resin.

Referring to FIGS. 1A to 4, 5B and 8B, a layer for forming intermediate layer CTLM is formed on the insulation layer INS where the first and second contact holes CH1 and CH2 are formed. The layer for forming intermediate layer CTLM may include an inorganic insulation layer made of an inorganic material or an organic insulation layer made of an organic material. The layer for forming intermediate layer CTLM may be formed of a material different from the insulation layer INS.

Figure 8A:
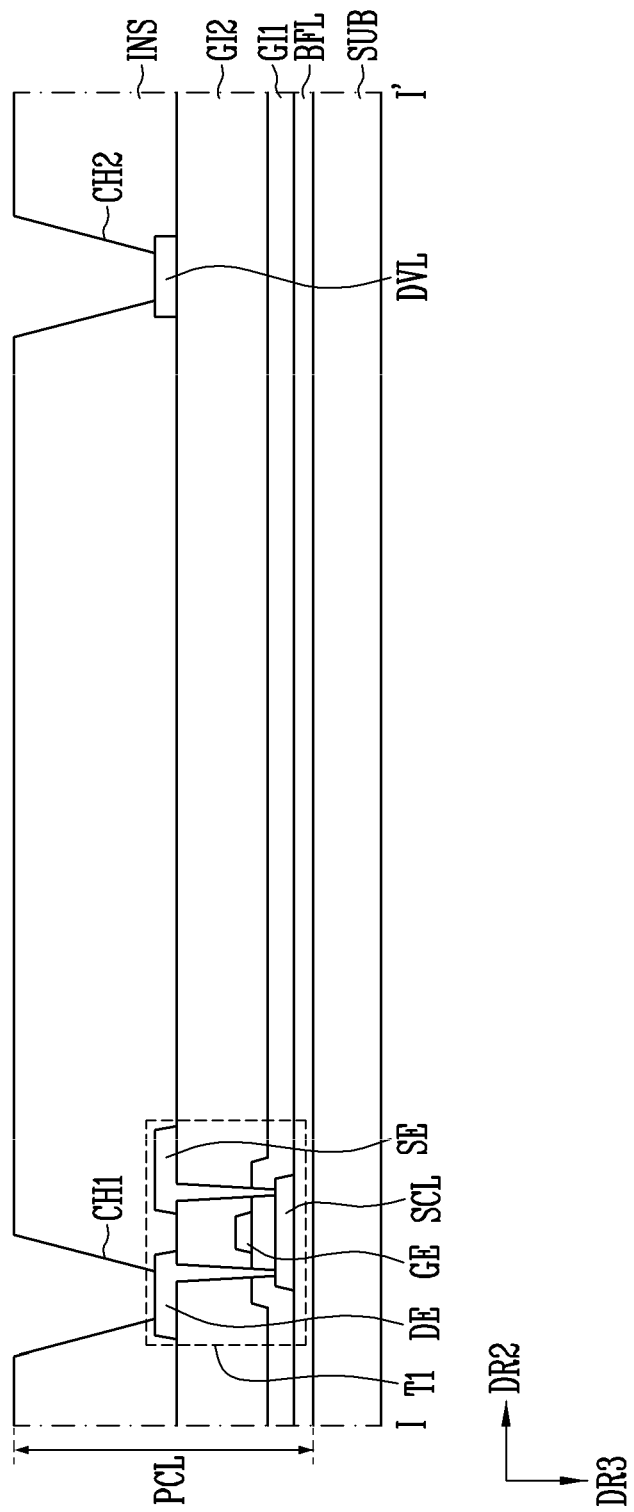
Figure 8B:
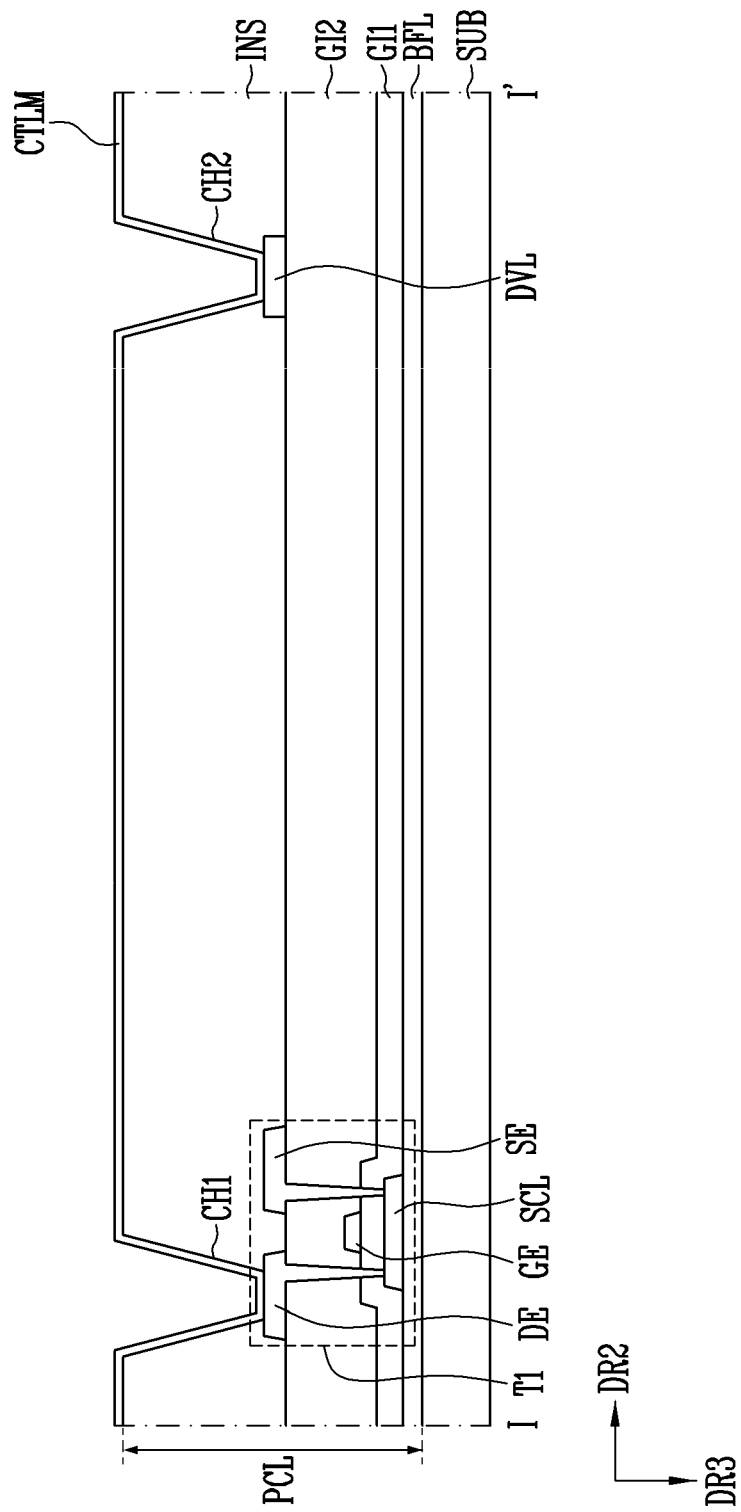

As shown in FIG. 8B, the layer for forming intermediate layer CTLM may be formed on a surface of the insulation layer INS exposed to the outside. For example, the layer for forming intermediate layer CTLM may cover the surface of the insulation layer INS, a portion of the drain electrode DE of the first transistor T1 exposed by the first contact hole CH1, and a portion of the driving voltage line DVL exposed by the second contact hole CH2.

Referring to FIGS. 1A to 4, 5B and 8C, an opening OP may be formed by etching a portion of the layer for forming intermediate layer CTLM. Accordingly, an intermediate layer CTL including the opening OP may be formed on the insulation layer INS. For example, by using a dry etching process, the opening OP may be formed in the layer for forming intermediate layer CTLM.

Figure 8C:
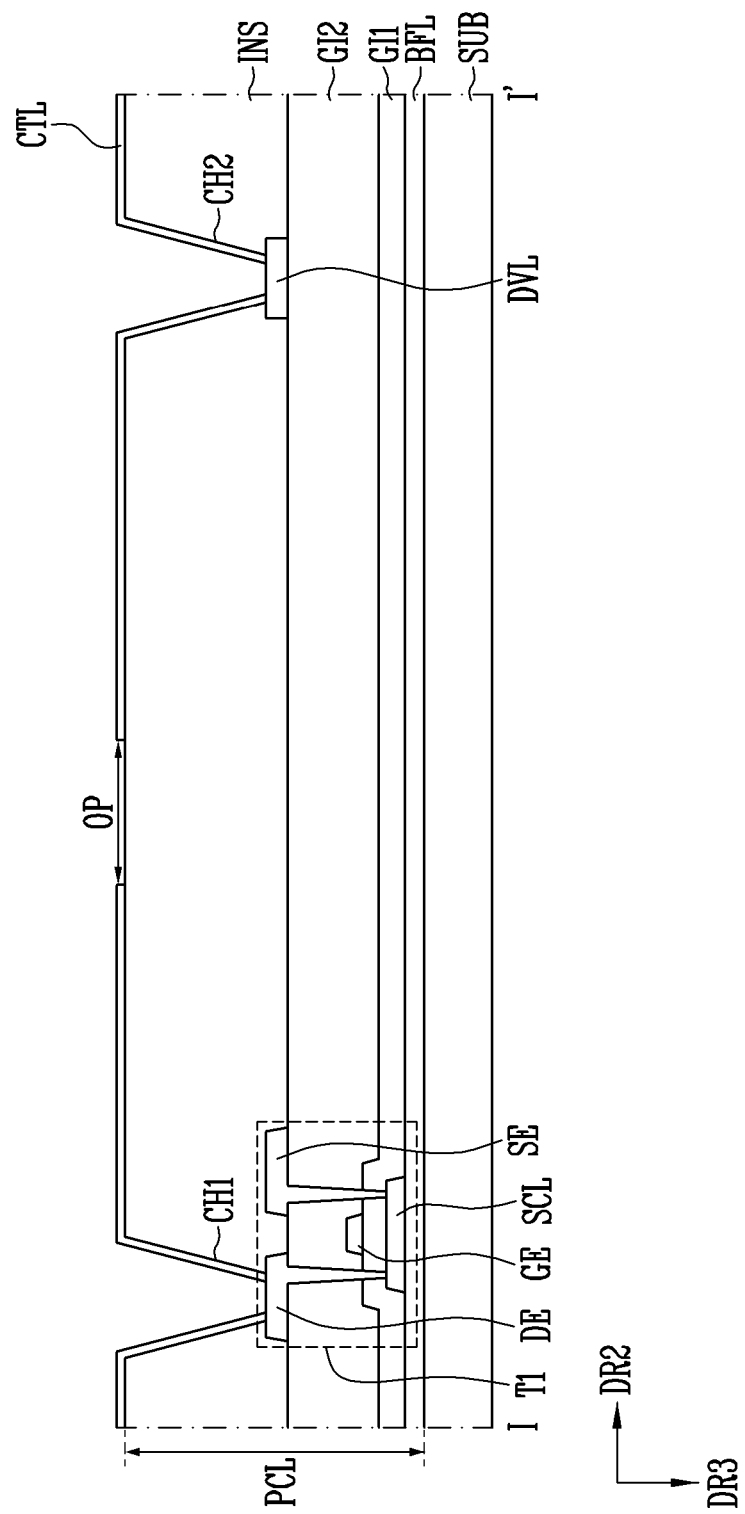

As shown in FIG. 8C, in the process of forming the opening OP in the layer for forming intermediate layer CTLM, the layer for forming intermediate layer CTLM covering a portion of the drain electrode DE of the first transistor T1 and a portion of the driving voltage line DVL may be etched. Accordingly, a portion of the drain electrode DE of the first transistor T1 may be exposed by the first contact hole CH1, and a portion of the driving voltage line DVL may be exposed by the second contact hole CH2.

Referring to FIGS. 1A to 4, 5B and 8D, a portion of the insulation layer INS exposed by the opening OP may be etched to form a groove G concave in the direction toward the substrate SUB.

Figure 8D:
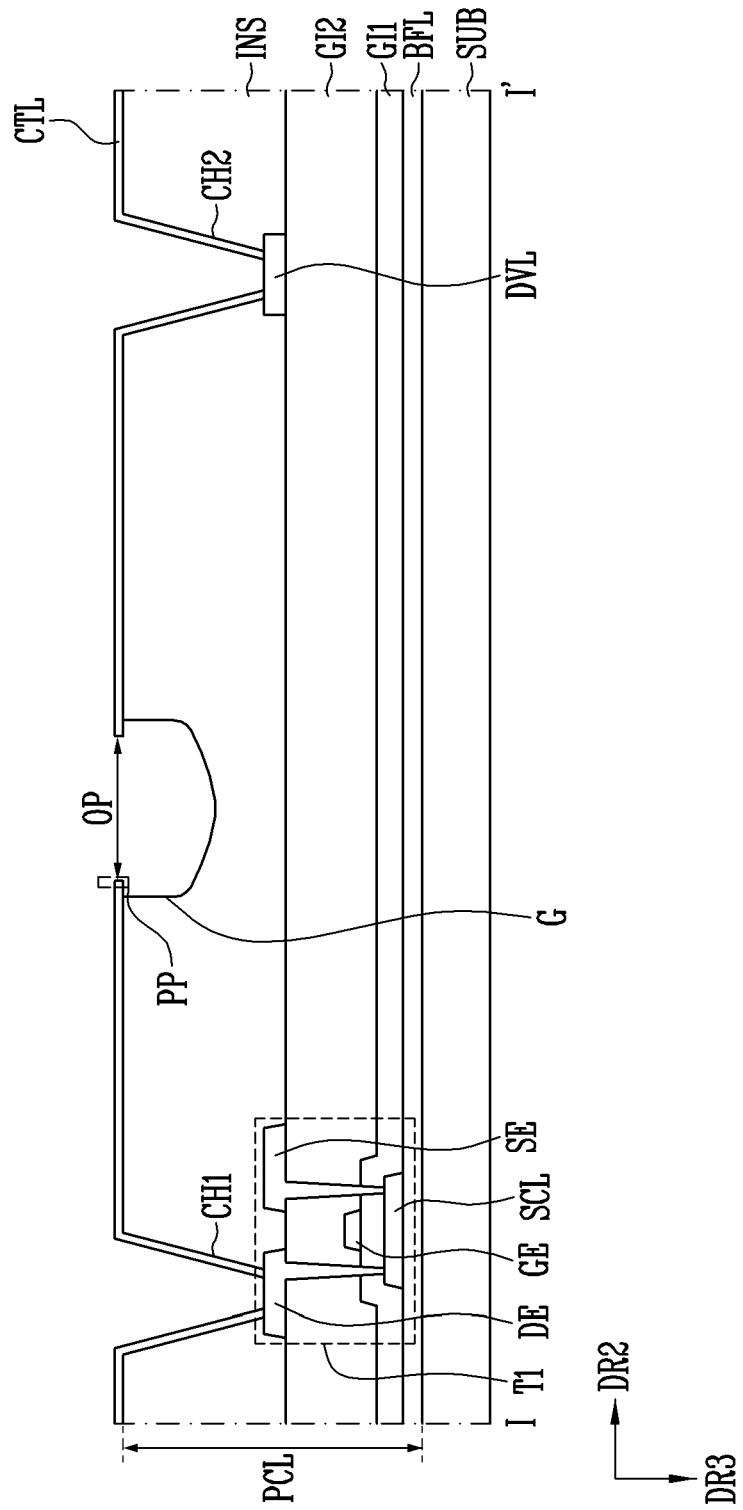

Referring to FIGS. 5B and 8D, in the forming of the groove G, the width d2 of the groove G in the second direction DR2 may be larger than the width d1 of the opening OP in the second direction DR2. A portion of the insulation layer INS exposed by the opening OP of the intermediate layer CTL may be undercut to form the width d2 of the groove G in the second direction DR2 larger than the width d1 of the opening OP in the second direction DR2.

In order to undercut the insulation layer INS, for example, a wet etching process may be used. The insulation layer INS may include a material having a higher etching rate for the wet etching than the intermediate layer CTL. For example, the insulation layer INS may be formed of silicon oxide (SiOx) having a high etching rate for the wet etching, and the intermediate layer CTL may be formed of silicon nitride (SiNx) having a low etching rate for the wet etching.

Referring to FIGS. 1A to 4, 5B and 8E, a first electrode EL1 and a second electrode EL2 extending in the first direction DR1 and spaced apart from each other in the second direction DR2 different from the first direction DR1 may be formed on the intermediate layer CTL. The first electrode EL1 and the second electrode EL2 may be spaced apart from each other with the opening OP of the intermediate layer CTL interposed therebetween.

The first electrode EL1 may also be formed on a portion of the drain electrode DE of the first transistor T1 exposed by the first contact hole CH1. The second electrode EL2 may also be formed on a portion of the driving voltage line DVL exposed by the second contact hole CH2.

The first and second electrodes EL1 and EL2 may include a conductive material with high light reflectance, such as Ag, Mg, Al, Pt, Pd, Au, Ni, Nd, Ir, Cr, Ti, and/or alloys thereof.

Figure 8E:
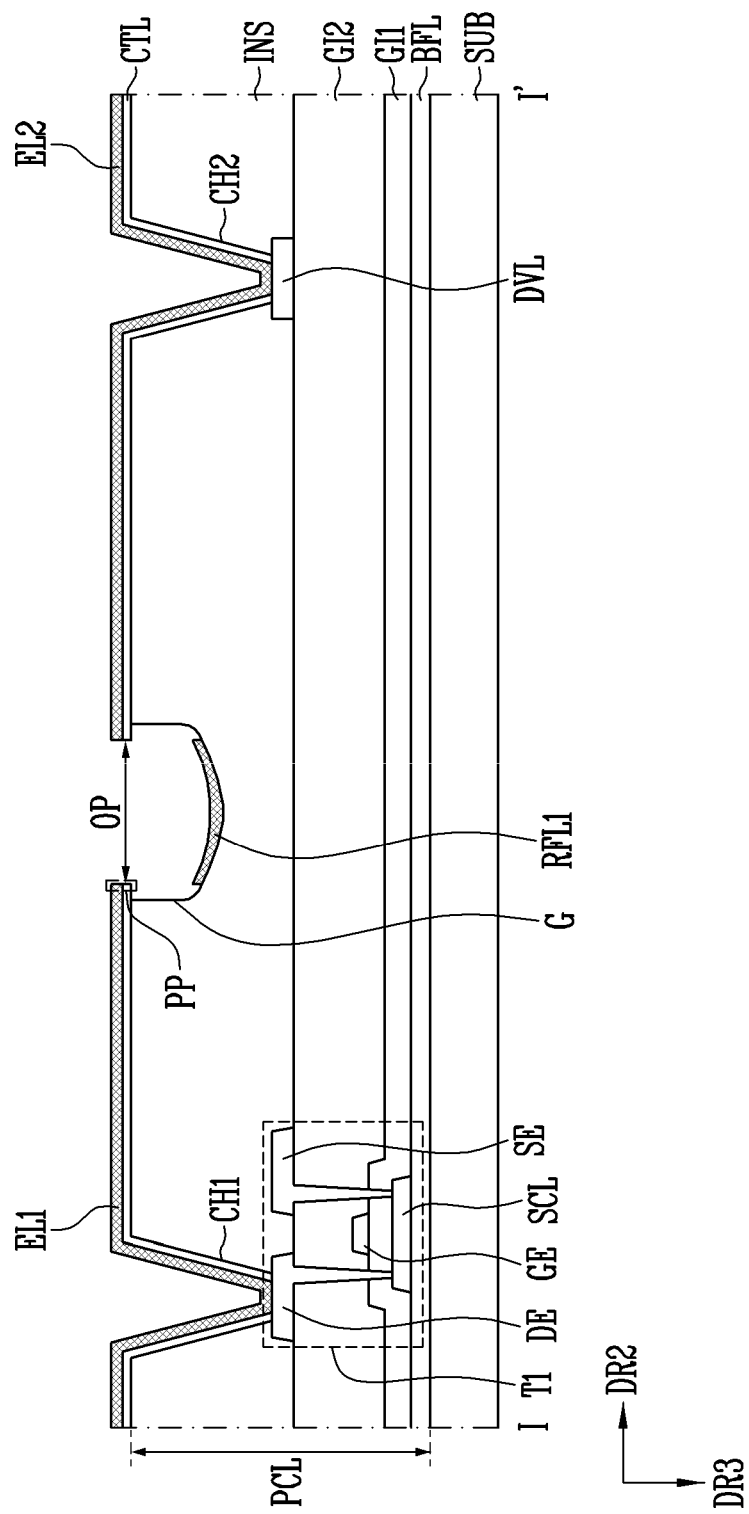

As shown in FIG. 8E, a first reflective layer RFL1 may be formed on at least a portion of the groove G. The first and second electrodes EL1 and EL2 and the first reflective layer RFL1 may be concurrently (e.g., simultaneously) formed. For example, the first and second electrodes EL1 and EL2 and the first reflective layer RFL1 may include the same or substantially the same metallic material.

Referring to FIGS. 8D and 8E, as a portion of the insulation layer INS exposed by the opening OP is undercut, the intermediate layer may include a portion PP (hereinafter, protruded portion) overlapping a portion of the groove G. As a metallic material is applied (or deposited) on the intermediate layer CTL, first and second electrodes EL1 and EL2 may be formed on the intermediate layer CTL, and a first reflective layer RFL1 may be formed on a portion of the groove G exposed by the opening OP. Accordingly, with respect to the third direction DR3, the protruded portion PP of the intermediate layer CTL and the protruded portion PP of the first and second electrodes EL1 and EL2 may be on the same line. In addition, the protruded portion PP of the intermediate layer CTL and one end of the first reflective layer RFL1 may be on the same line. For example, the width d1' of the first reflective layer RFL1 in the second direction DR2 may be the same or substantially the same as the width d1 of the opening OP in the second direction DR2 or the distance d1 between the first electrode EL1 and the second electrode EL2 in the second direction DR2.

Figure 8F:
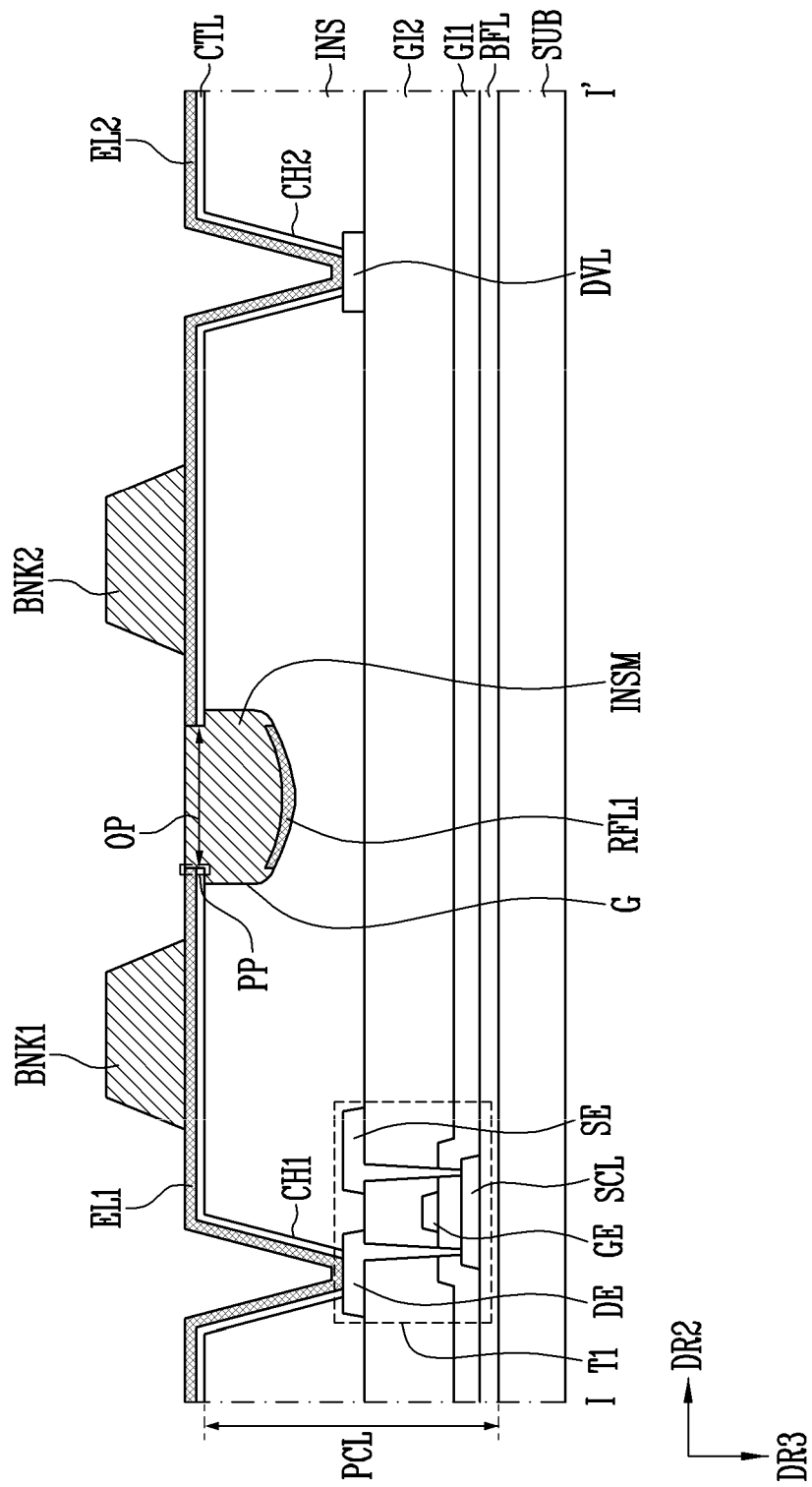

Referring to FIGS. 1A to 4, 5B and 8F, the insulation material INSM may be filled into the groove G on which the first reflective layer RFL1 is formed. As shown in FIG. 8F, the insulation material INSM may be filled the groove G, the opening OP of the intermediate layer CTL and between the first and second electrode EL1 and EL2, and may form a flat surface with the first and second electrode EL1 and EL2.

The insulation material INSM may include an inorganic insulation material or an organic insulation material. Here, the inorganic insulation material may include at least one of metal oxides such as silicon oxide (SiOx), silicon nitride (SiNx), silicon nitride (SiON), and/or AlOx. The organic insulation material may include at least one selected from, for example, polyacrylates resins, epoxy resins, phenolic resins, polyamides resins, and polyimide resins, unsaturated polyesters resin, poly-phenylene ethers resin, poly-phenylene sulfides resin, and benzocyclobutene resin.

The filling the insulation material INSM may further include forming a first bank BNK1 on the first electrode EL1 and forming a second bank BNK2 on the second electrode EL2. The process of filling the insulation material INSM in the groove G and the process of forming the first and second bank BNK1 and BNK2 may be performed concurrently (e.g., simultaneously). For example, the insulation material INSM and the first and second banks BNK1 and BNK2 may be formed of the same or substantially the same material.

Referring to FIGS. 1A to 4, 5B and 8G, a second reflective layer RFL2 may be formed on the first and second banks BNK1 and BNK2. The second reflective layer RFL2 may include the same metallic material or a different metallic material as the metallic material included in the first and second electrodes EL1 and EL2.

Referring to FIGS. 1A to 4, 5B and 8G, a light emitting element LD may be provided on the substrate SUB including the first and second electrodes EL1 and EL2.

For example, the light emitting element LD may be provided on the light emitting area of the pixel PXL through an inkjet printing method, a slit coating method, and/or various other suitable methods. For example, the light emitting element LD may be mixed with a volatile solvent, and may be supplied to light emitting area of the pixel PXL through an inkjet printing method and/or a slit coating method.

For example, the inkjet nozzle may be on the insulation material INSM, and a solvent including a plurality of light emitting elements LD may be provided on the light emitting area of the pixel PXL through the inkjet nozzle. Here, the solvent may be at least one selected from acetone, water, alcohol and toluene, but the present disclosure is not limited thereto. For example, the solvent may be in a form of ink or paste. The method of providing the light emitting devices LD on the light emitting area of the pixel PXL is not limited to the exemplary embodiment described above, and the method of providing the light emitting devices LD may be variously changed. The above-described light emitting area of the pixel PXL may be one area of the display area DA, for example, a pixel area in which each pixel PXL is provided, and an area in which light is emitted by the light emitting elements LD provided in the display area DA, but the present disclosure is not limited thereto.

The solvent may be removed after the light emitting elements LD are provided on the light emitting area of the pixel PXL.

By applying an alignment signal to the first and second electrodes EL1 and EL2, the light emitting element LD may be aligned between the first electrode EL1 and the second electrode EL2. For example, the first and second electrodes EL1 and EL2 may function as alignment electrodes (or alignment lines) for aligning the light emitting element LD. When the alignment signal is applied to the first and second electrodes EL1 and EL2, a self-alignment of the light emitting element LD may be induced due to an electric field formed between the first electrode EL1 and the second electrode EL2.

A first alignment signal applied to the first electrode EL1 and a second alignment signal applied to the second electrode EL2 may be signals having a voltage difference and/or a phase difference such that the light emitting element LD can be aligned between the first electrode EL1 and the second electrode EL2. For example, the first alignment signal and the second alignment signal may have different voltage levels. In addition, at least some of the first alignment signal and the second alignment signal may be alternating current signals, but the present disclosure is not limited thereto.

In addition, by controlling the alignment signal (or alignment voltage) applied to the first electrode EL1 and the second electrode EL2 or forming a magnetic field when the light emitting element LD is aligned, the light emitting element LD may be aligned to be relatively biased between the first electrode EL1 and the second electrode EL2. For example, the light emitting element LD may be aligned to be biased so that one end thereof may face the first electrode EL1 and the other end thereof may face the second electrode EL2. On the contrary, the light emitting element LD may be aligned to be biased so that one end thereof may face the second electrode EL2 and the other end thereof may face the first electrode EL1.

Figure 8H:
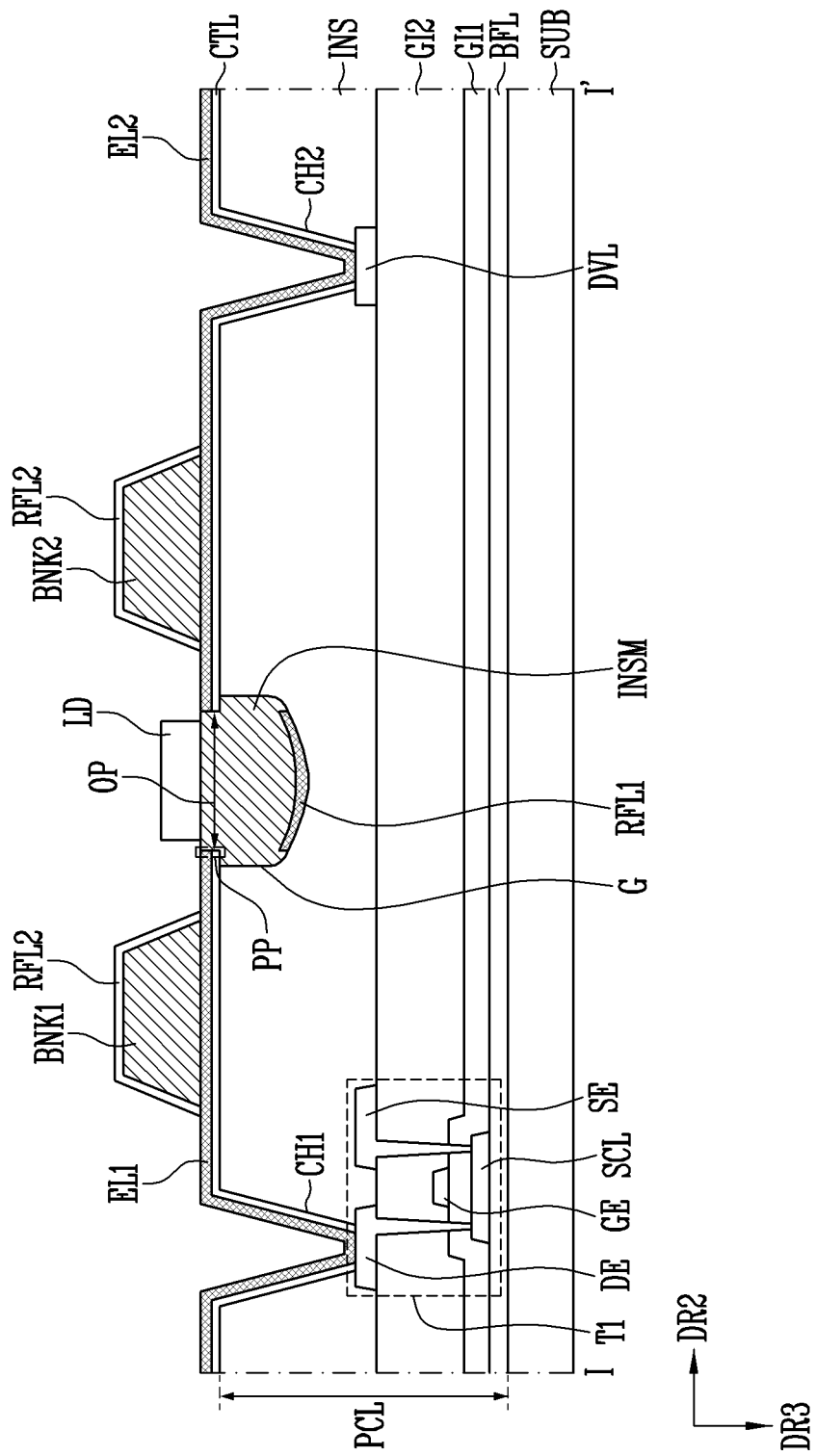
Figure 8I:
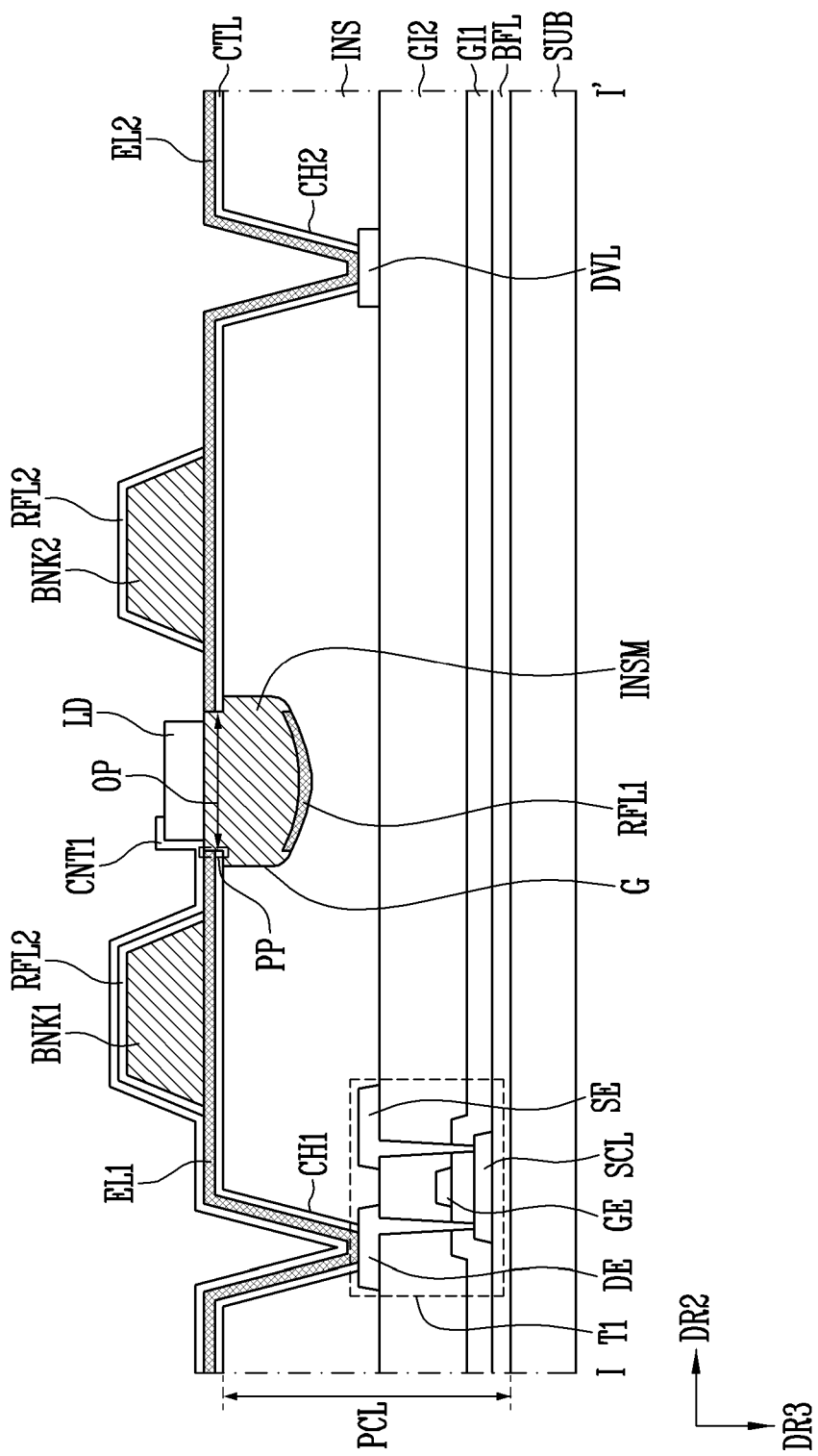

As shown in FIG. 8H, the light emitting element LD aligned between the first and second electrodes EL1 and EL2 may overlap the groove G of the insulation layer INS. In some embodiments, the light emitting element LD may overlap the first reflective layer RFL1.

Figure 8J:
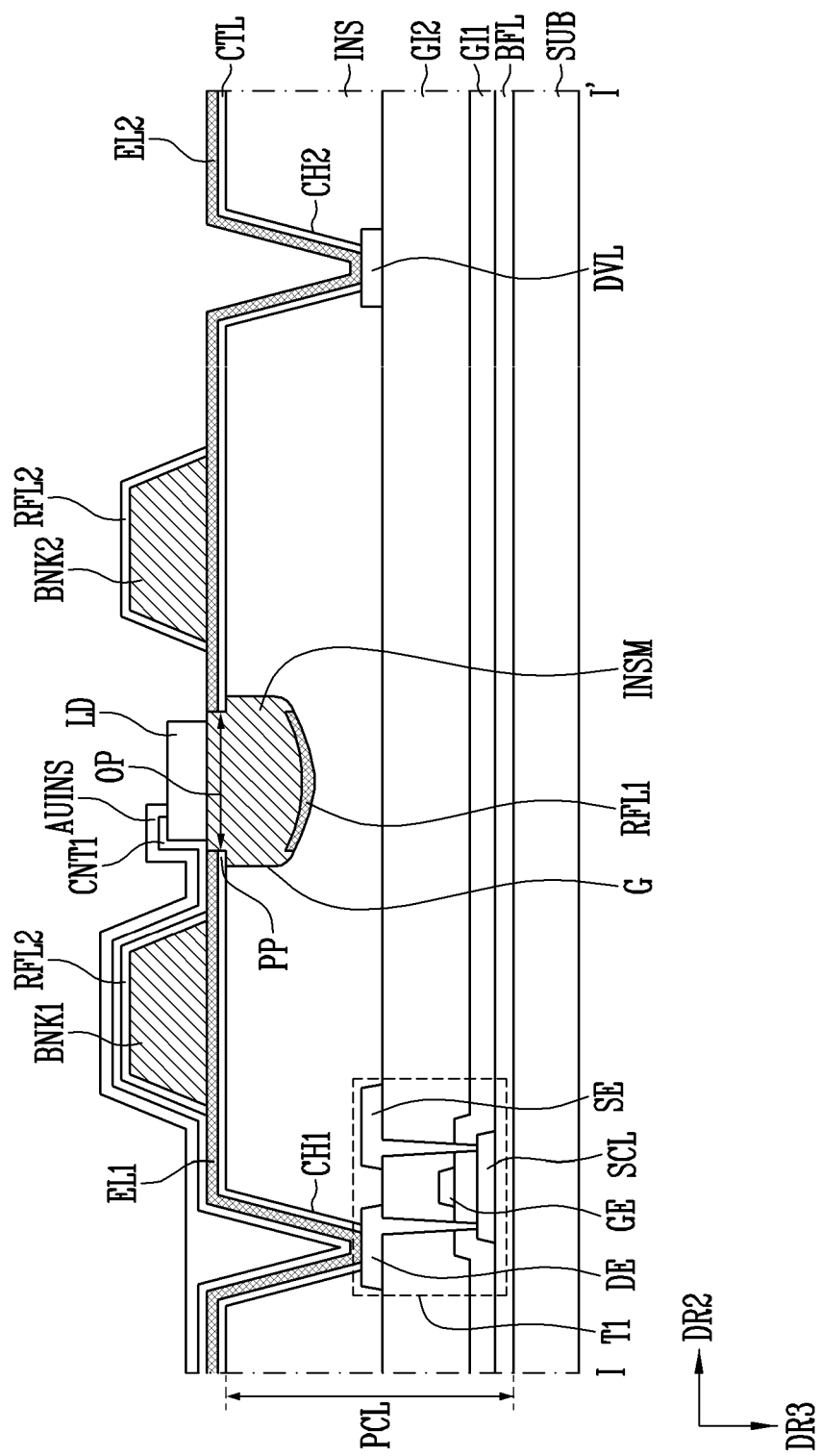

Referring to FIGS. 1A to 4, 5B and 8I to 8K, a first contact electrode CNT1 may be formed on the first electrode EL1. One end of the light emitting element LD on the insulation material INSM may contact (e.g., physically contact) the first contact electrode CNT1. As shown in FIG. 8J, an auxiliary insulation layer AUINS covering the first contact electrode CNT1 may be formed on the first contact electrode CNT1. The auxiliary insulation layer AUINS may be an inorganic insulation layer including an inorganic material or an organic insulation layer including an organic material.

Figure 8K:
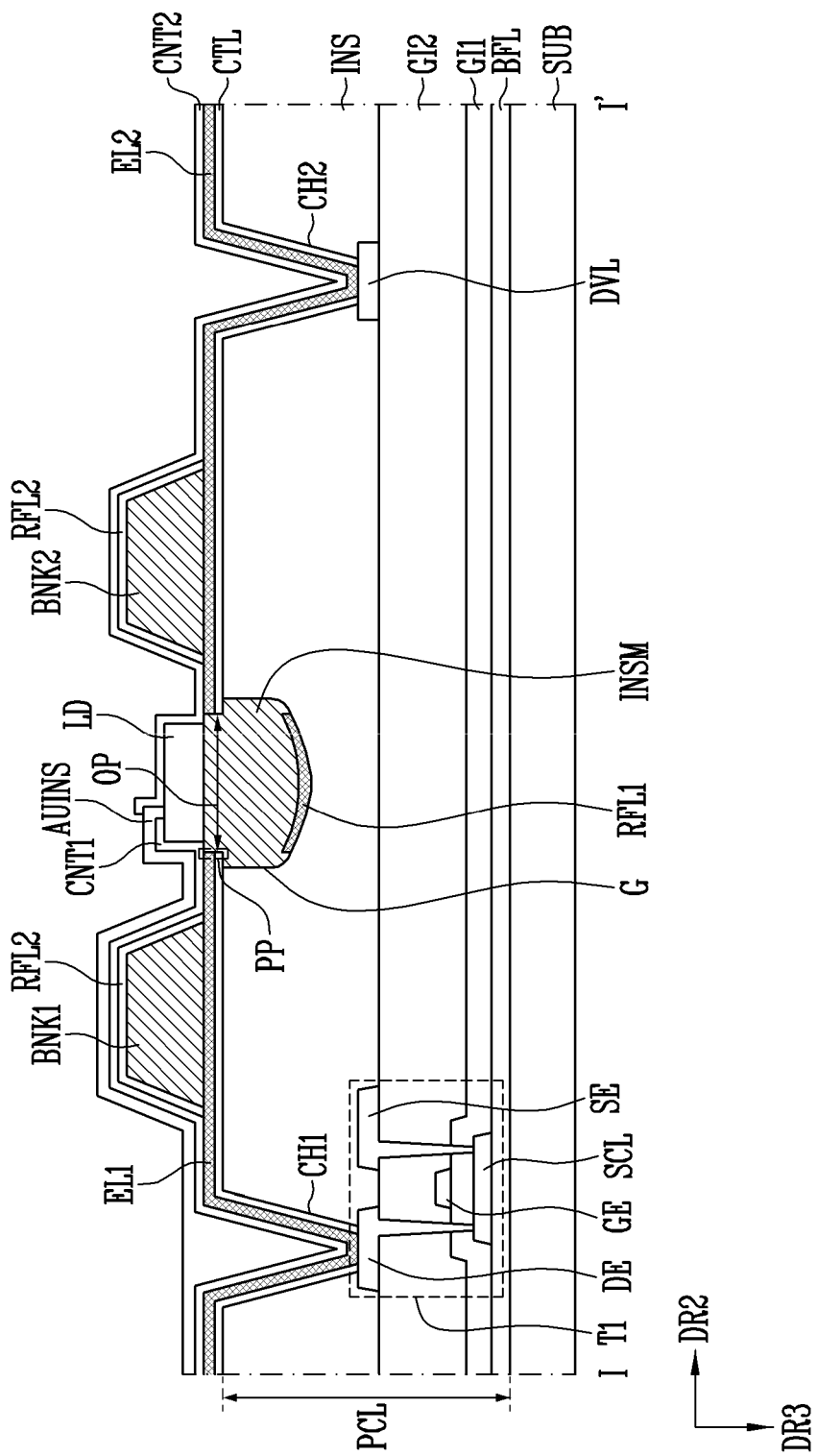
Figure 8L:
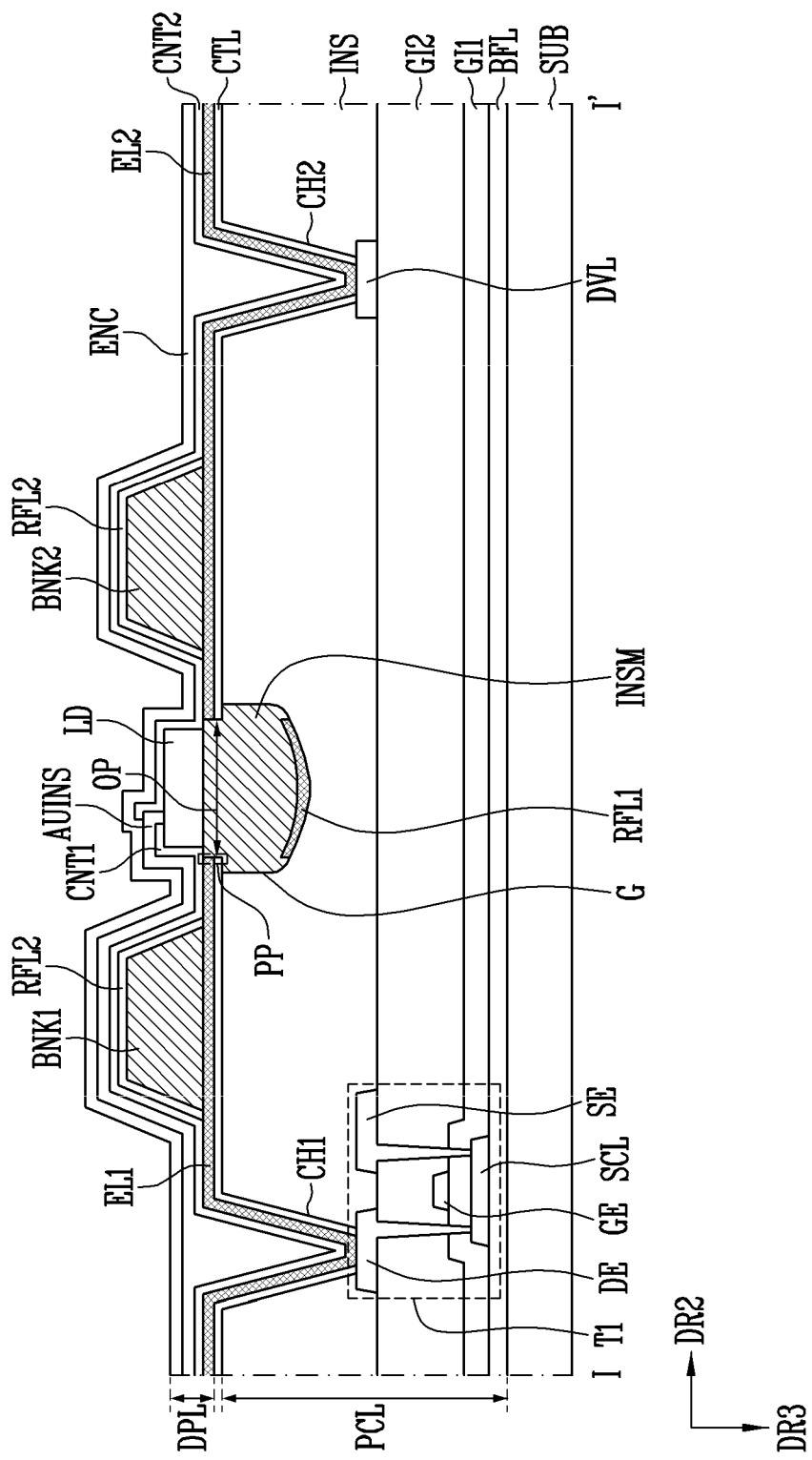

As shown in FIG. 8K, the second contact electrode CNT2 may be formed on the second electrode EL2. The other end of the light emitting element LD on the insulation material INSM may contact (e.g., physically contact) the second contact electrode CNT2. The second contact electrode CNT2 may be on a portion of the light emitting element LD exposed by the auxiliary insulation layer AUINS and the auxiliary insulation layer AUINS. The first and second contact electrodes CNT1 and CNT2 may be spaced apart from each other by the auxiliary insulation layer AU INS.

Referring to FIGS. 1A to 4, 5B and 8L, the encapsulation layer ENC may be formed on the first and second electrodes EL1 and EL2. In some embodiments, an overcoat layer may be formed on the encapsulation layer ENC.

The above-detailed description illustrates and explains embodiments of the present disclosure. In addition, the above-detailed description merely illustrates exemplary embodiments of the present disclosure, the subject matter of the present disclosure may be used in various other suitable combinations, changes, and environments as described above, and the scope of the concepts disclosed herein may be changed or modified within the scope of equivalents and/or techniques or knowledge in the art. Therefore, the above-detailed description is not intended to limit the present disclosure to the disclosed embodiments. In addition, the appended claims should be construed to include other embodiments, and equivalents thereof.

What is claimed is:

1. A display device comprising:
    an insulation layer on a substrate and having a groove concave in a direction toward the substrate;
    a first reflective layer on at least a portion of the insulation layer; and
    a display element layer on the insulation layer and the first reflective layer, the display element layer comprising a light emitting element overlapping at least a portion of the groove,
    wherein the display element layer includes:
    a first electrode extending in a first direction different from the direction and electrically coupled to the light emitting element; and
    a second electrode spaced apart from the first electrode in a second direction different from the first direction and electrically coupled to the light emitting element,
    wherein the groove is filled with an insulation material,
    wherein the insulation material forms a flat surface with the first electrode and the second electrode, and
    wherein the light emitting diode is on the flat surface.

2. The display device of claim 1, wherein,
    the first reflective layer is on the groove and overlaps the light emitting element.

3. The display device of claim 1, wherein,
    each of the first electrode and the second electrode has a portion overlapping a portion of the groove.

4. The display device of claim 1, wherein,
    a distance between the first electrode and the second electrode in the second direction is less than a width of the groove in the second direction.

5. The display device of claim 1, wherein,
    a distance between the first electrode and the second electrode in the second direction is the same as a width of the first reflective layer in the second direction.

6. The display device of claim 1, wherein,
    the first and second electrodes and the first reflective layer include a same metallic material.

7. The display device of claim 1, the display element layer further comprising:
    a first bank on the first electrode; and
    a second bank on the second electrode.

8. The display device of claim 7, the display element layer further comprising:
    a second reflective layer on the first and second banks.

9. The display device of claim 1, further comprising
    an intermediate layer between the first electrode and the insulation layer and between the second electrode and the insulation layer, and having an opening overlapping the groove.

10. The display device of claim 9, wherein,
    a distance between the first electrode and the second electrode in the second direction is the same as a width of the opening in the second direction.

11. The display device of claim 9, wherein,
    a width of the opening in the second direction is less than a width of the groove in the second direction.

12. The display device of claim 1, the display element layer further comprising:
    a first contact electrode on the first electrode and configured to electrically connect the first electrode and the light emitting element; and
    a second contact electrode on the second electrode and configured to electrically connect the second electrode and the light emitting element.

* * * * *